(12) United States Patent
Tanaka

(10) Patent No.: US 6,441,644 B1
(45) Date of Patent: Aug. 27, 2002

(54) LOGIC DEVICE FOR OUTPUTTING A SIGNAL WITHIN A THROUGH RATE RANGE

(75) Inventor: Wataru Tanaka, Hyogo (JP)

(73) Assignees: Mitsubishi Denki Kabushiki Kaisha, Toyota; Mitsubishi Electric System LSI Design Corporation, Itami, both of (JP)

( * ) Notice: Subject to any disclaimer, the term of this patent is extended or adjusted under 35 U.S.C. 154(b) by 0 days.

(21) Appl. No.: 09/588,682

(22) Filed: Jun. 7, 2000

(30) Foreign Application Priority Data

Dec. 24, 1999 (JP) ............................................ 11-368258

(51) Int. Cl.⁷ .................. H03K 19/094; H03K 19/0175
(52) U.S. Cl. ............................ 326/86; 326/87; 326/83; 326/27
(58) Field of Search ........................... 326/86, 87, 83, 326/27, 84, 85

(56) References Cited

U.S. PATENT DOCUMENTS

| | | | | |
|---|---|---|---|---|
| 4,779,013 A | * | 10/1988 | Tanaka | 326/27 |
| 4,797,579 A | * | 1/1989 | Lewis | 326/15 |
| 4,829,199 A | * | 5/1989 | Prater | 326/27 |
| 5,166,551 A | * | 11/1992 | Kamuro | 326/84 |
| 5,220,208 A | * | 6/1993 | Schenck | 326/27 |
| 6,051,995 A | * | 4/2000 | Pollachek | 326/87 |
| 6,100,729 A | * | 8/2000 | Nagano et al. | 327/112 |
| 6,236,237 B1 | * | 5/2001 | Wong et al. | 326/83 |

FOREIGN PATENT DOCUMENTS

| | | | |
|---|---|---|---|
| JP | 5-47186 | 2/1993 | |
| JP | 405206800 A | * 8/1993 | 327/153 |
| JP | 405206880 A | * 8/1993 | 327/153 |
| JP | 6-61762 | 3/1994 | |
| JP | 11-17516 | 1/1999 | |

* cited by examiner

Primary Examiner—Michael G. Lee
Assistant Examiner—Steven S. Paik
(74) Attorney, Agent, or Firm—Burns, Doane, Swecker & Mathis, LLP

(57) ABSTRACT

When a level of an input signal is suddenly changed to a low level (or a high level), a driving p-channel MOS transistor of a weak driving performance (or a driving n-channel MOS transistor of a weak driving performance) is turned on to control an output-stage n-channel MOS transistor (or an output-stage p-channel MOS transistor) to output an output signal gradually level-changing, and a through-rate correcting n-channel MOS transistor of a middle driving performance (or a through-rate correcting p-channel MOS transistor of a middle driving performance) is turned on to control the output-stage n-channel MOS transistor (or the output-stage p-channel MOS transistor) to output the output signal, of which the level is immediately and sharply changed in its level change beginning period and is successively and smoothly changed in the entire level change period. Therefore, the output signal can be output to an external load within a prescribed range of a through rate of the output signal while suppressing the occurrence of an unnecessary radiation noise.

7 Claims, 10 Drawing Sheets

LOGIC DEVICE FOR OUTPUTTING A SIGNAL WITHIN A THROUGH RATE RANGE

BACKGROUND OF THE INVENTION

1. Field of the Invention

The present invention relates to a logic device in which a signal changing with an external load is output within a prescribed range of a through rate such as a rise time or a fall time while suppressing an unnecessary radiation noise.

2. Description of Related Art

A prescribed range is generally standardized for a through rate (for example, a rise time or a fall time) of an output signal of which a level changes with an external load. For example, standards of a Universal Serial Bus (USB) used for computer peripheral apparatuses have been approved. A signal output from a device transmits through the USB at a data rate of 1.5 M bits per second in a low speed data communication. The USB standards relate to a level of the signal output from the device, and the USB standards require that the output signal is accurately raised up and fallen down within a time-period range of from 75 to 300 nanosecond in the low speed data communication on condition that an external load ranges from 200 pF to 600 pF. Therefore, the through rate of the output signal is required to be fixed within a prescribed range.

As a conventional logic device in which a signal is output within a through rate range regulated in the USB standards, an output buffer circuit disclosed in the Published Unexamined Japanese Patent Application No. 17516 of 1999 (H11-17516) has been known. FIG. 9 is a circuit diagram showing the configuration of the output buffer circuit disclosed in the Patent Application No. 17516 of 1999, and FIG. 10 is a waveform diagram showing simulation results of level changes of output signals in a low speed operation of the output buffer circuit.

As shown in FIG. 9, reference numerals 11, 12, 13, 14, 15, 16, 17 and 18 indicate inverter circuits. Each inverter circuit fundamentally outputs an signal of a high electric level (H level) corresponding to a logical value "1" (positive logic) when a p-channel metal oxide semiconductor (MOS) transistor of the inverter circuit is turned on by receiving a signal of a low electric level (L level) corresponding to a logical value "0" at a gate of the p-channel MOS transistor. Also, each inverter circuit fundamentally outputs an signal of an L level when an n-channel MOS transistor of the inverter circuit is turned on by receiving a signal of an H level at a gate of the n-channel MOS transistor. The Output of each of the inverter circuits 13, 14, 15 and 16 is controlled according to enable signals LSB and LS or enable signals FSB and FS. Also, by using a source voltage VDD and a reference voltage VSS (VSS is equal to the ground voltage of 0 V), a threshold voltage (that is, a switching voltage) of each of the inverter circuits 11, 13 and 14 is a value higher than (VDD−VSS)/2, and a threshold voltage of each of the inverter circuits 12, 15 and 16 is a value lower than (VDD−VSS)/2. A reference numeral 130 indicates a control circuit, each of reference numerals 140a and 140b indicates a delay circuit, a reference numeral 151 indicates a first-stage buffer, a reference numeral 152 indicates a second-stage buffer, a reference numeral 153 indicates a third-stage buffer, a reference symbol P0 indicates a p-channel MOS transistor of the first buffer 151, and a reference symbol N0 indicates an n-channel MOS transistor of the first buffer 151. A reference symbol P1 indicates a p-channel MOS transistor of the second buffer 152, and a reference symbol N1 indicates an n-channel MOS transistor of the second buffer 152. A reference symbol P2 indicates a p-channel MOS transistor of the third buffer 153, and a reference symbol N2 indicates an n-channel MOS transistor of the third buffer 153. A reference symbol Cap indicates a condenser arranged between a node DD and the ground of the voltage VSS.

An operation of the output buffer circuit is described on condition that the logical value of an input signal D is changed from "1" to "0" in a low mode speed operation according to the positive logic. Also, in this low mode operation, the inverter circuits 13 and 15 are controlled by the enable signals LSB and LS to be operable.

When the logical value of an input signal D is changed from "1" to "0", a level of a signal output from the inverter circuit 17 is heightened as the level of the input signal D becomes lowered, and the signal is input to the inverter circuit 18. As the level of the signal input to the inverter circuit 18 is heightened, a p-channel MOS transistor PU of the inverter circuit 18 starts to turn off, and an n-channel MOS transistor ND of the inverter circuit 18 starts to turn on. As a result, a charge of the node DD set to the level VDD is discharged to the ground through the n-channel MOS transistor ND. In this case, because the condenser Cap is arranged between the node DD and the ground, as shown in FIG. 10, the level of the node DD is gradually changed from the H level (VDD level) to the L level (VSS level).

Because a threshold voltage $Vth^{11}$ of the inverter circuit 11 is higher than (VDD−VSS)2, that is, VDD2 in case of VSS=0 V (ground level), as the level of the input signal D is lowered, the level of the input signal D reaches the threshold voltage $Vth^{11}$ of the inverter circuit 11, and the logical value of a signal Pu1 output from the inverter circuit 11 is changed from "0" to "1" before the level of the input signal D reaches VDD/2.

In contrast, the level of the node DD is gradually lowered while being delayed as compared with the lowering of the level of the input signal D, and the level of the node DD reaches a threshold voltage $Vth^{13}$ of the inverter circuit 13. As a result, as shown in FIG. 10, the level of a signal Pu2 output from the inverter circuit 13 is heightened. That is, the logical value of the signal Pu2 is changed from "0" to "1". In this case, the level change of the signal Pu1 is earlier than that of the signal Pu2. Thereafter, the p-channel MOS transistor P0 of the first-stage buffer 151 and the p-channel MOS transistor P1 of the second-stage buffer 152 start to turn off. Also, the p-channel MOS transistor P2 of the third-stage buffer 153 starts to turn off.

Thereafter, when the level of the input signal D continues to be lowered, a p-channel MOS transistor P10 is rapidly turned on so as to assist the p-channel MOS transistor P1 of the second-stage buffer 152 to be turned off, and a p-channel MOS transistor P11 is rapidly turned on so as to assist the p-channel MOS transistor P2 of the third-stage buffer 153 to be turned off. As a result, as shown in FIG. 10, the level of the signal Pu2 is sharply changed toward the high level (VDD) in the first half of the fall time of the input signal D while changing a waveform of the signal Pu2 stepwise, and a level of a signal Q of an output pad Q is sharply lowered in the middle of the fall time of the signal Q.

Thereafter, when the level of the input signal D is lowered to a threshold voltage $Vth^{12}$ of the inverter circuit 12 lower than VDD/2, the logical value of a signal Pd1 output from the inverter circuit 12 is changed from "0" to "1". Therefore, the n-channel MOS transistor N0 of the first-stage buffer 151 starts to turn on. However, at this time, the level of the node DD, which is set by discharging the charge of the node DD to the ground through the inverter circuit 18, is not lowered to a threshold voltage Vth$^{15}$ of the inverter circuit 15. Therefore, the n-channel MOS transistor N1 of the second buffer 152 and the n-channel MOS transistor N2 of the third buffer 153 are respectively maintained to an "off" condition.

Thereafter, when the level of the node DD reaches the threshold voltage Vth$^{15}$ of the inverter circuit 15, as shown in FIG. 10, the logical value of a signal Pd2 output from the inverter circuit 15 is changed from "0" to "1". Therefore, the n-channel MOS transistor N1 and the n-channel MOS transistor N2 start to turn on. In this case, because the delaying circuit 140*b* is arranged between the inverter circuit 15 and the n-channel MOS transistor N2, the level change of the n-channel MOS transistor N2 is later than that of the n-channel MOS transistor N1. Therefore, as shown in FIG. 10, the level of the signal Q of the output pad Q is rapidly lowered to the L level (VSS) in the second half of the fall time of the input signal D.

Accordingly, because the first-stage buffer 151, the second-stage buffer 152 and the third-stage buffer 153 are operated one by one in that order while shifting the level changing timing of the MOS transistors, the through rate of the output signal Q can be set within a prescribed range.

However, as shown in FIG. 10, a point QQ, at which the level of the output signal Q is unevenly fallen down in synchronization with the raising-up of the signal Pd2, occurs during the fall time of the input signal D in the low speed mode operation in the output buffer circuit. Also, in the same manner, another point QQ, at which the level of the output signal Q is unevenly raised up in synchronization with the falling-down of the signal Pu2, occurs during the rise time of the input signal D in the low speed mode operation in the output buffer circuit. The uneven falling-down and uneven raising-up of the level at the points QQ occur because the output pad Q is driven while shifting the changing timing of the transistors. Therefore, the output signal includes higher harmonic wave components at the points QQ, so that there is a drawback that the higher harmonic wave components function as an unnecessary radiation noise in the output signal Q.

SUMMARY OF THE INVENTION

A main object of the present invention is to provide, with due consideration to the drawback of the conventional logic device, a logic device in which a signal is output within a prescribed range of a through rate of the signal while suppressing the occurrence of an unnecessary radiation noise.

Also, a subordinate object of the present invention is to provide a logic device in which a cross point of waveforms of two differential signals and a ratio of through rates in the differential signals are respectively set within a prescribed range even though the logic device is used as a differential device outputting each differential signal.

Also, another subordinate object of the present invention is to provide a logic device in which a signal is output while setting a ratio of a rise time to a fall time in the signal within a prescribed range even though a driving performance of a transistor arranged in the logic device differs from a desired driving performance.

The main object is achieved by the provision of logic device in which a pair of output-stage transistors complementarily operated with each other are controlled according to an input signal received at an input terminal to output an output signal corresponding to the input signal to an output terminal and to charge or discharge an external load, comprising:

a control circuit for controlling one output-stage transistor, which is to be controlled to a turn-off condition, to be immediately turned off by a transistor of a strong driving performance, and controlling the other output-stage transistor, which is to be controlled to a turn-on condition, to be successively and smoothly turned on by a plurality of transistors respectively having a weak driving performance while controlling the other output-stage transistor by one transistor of the weak driving performance at a turning-on speed, at which a through rate is set within a prescribed range in a beginning period changing to the turn-on condition.

In the above configuration, when the level of the input signal is suddenly changed, the control circuit is operated. In detail, a transistor of the strong driving performance is operated according to the input signal, so that the output-stage transistor, which is to be controlled to a turn-off condition, is turned off. Because the transistor has the strong driving performance, the output-stage transistor is immediately turned off, so that the output-stage transistor has no relation to the production of an output signal.

Also, a transistor of a weak driving performance is operated according to the input signal to turn on the output-stage transistor to be controlled to a turn-on condition, so that the output signal is produced by the output-stage transistor. However, because the transistor has the weak driving performance, the transistor cannot make the output-stage transistor sharply change a level of the output signal in a beginning period, so that a through rate of the output signal cannot be set within a prescribed range. Therefore, another transistor of another weak driving performance is operated according to the input signal, and the output-stage transistor to be controlled to the turn-on condition is sharply turned on under control of the transistor in the beginning period at a turning-on speed, at which the through rate of the output signal is set within the prescribed range, so as to successively and smoothly change a level of the output signal in the entire level change period of the output signal.

Accordingly, because the output-stage transistor to be controlled to the turn-on condition is rapidly turned on in the beginning period in addition that the output-stage transistor to be controlled to the turn-on condition is gradually turned on in a transitional period following the beginning period, the output signal can be produced by the output-stage transistor while setting a through rate of the output signal within the prescribed range.

Also, because the turning-on speed of the second output-stage transistor in the beginning period is set to successively and smoothly change the level of the output signal in the entire level change period of the output signal, the occurrence of higher harmonic waves based on an uneven level change of a signal can be suppressed Therefore, the occurrence of an unnecessary radiation. noise can be suppressed.

Also, even though the logic device is used as a differential device to output a differential signal as the output signal, a cross point of waveforms of two differential signals can be set within a prescribed range, and a ratio of through rates in the differential signals can be set within a prescribed range.

Also, because the output-stage transistor to be controlled to the turn-on condition is operated under control of the transistors, even though a pull-up resistor or a pull-down resistor is used as the external load, the adverse influence of the pull-up resistor or the pull-down resistor on a rise time or a fall time in the output signal can be prevented by the function of the transistors, so that the rise time and the fall time in the output signal can be set to be equal to each other.

It is preferred that the control circuit comprises:
a first transistor, having a middle driving performance, for functioning in the beginning of a period in which the output-stage transistor to be controlled to the turn-on condition is changed to the turn-on condition and controlling the output-stage transistor, which is to be controlled to the turn-on condition, at the turning-on speed, at which the through rate of the output signal at the output terminal is set within the prescribed range; and
a second transistor, having a weak driving performance, for controlling the output-stage transistor, which is to be controlled to the turn-on condition, in a transition period continued until the output-stage transistor is changed to the turn-on condition and reaches a steady condition and making the output-stage transistor, which is to be controlled to the turn-on condition, output the output signal in which a higher harmonic component is reduced.

In the above configuration, because the second transistor has the low driving performance, the second transistor has substantially no relation to the production of the output signal in the beginning period, but the second driving transistor make the output-stage transistor gradually change the level of the output signal in the transition period following the beginning period. In this case, the rapid level change of the output signal in the beginning period is smoothly succeeded to the gradual level change in the transition period, so that the level of the output signal is smoothly changed during the entire level change period.

Accordingly, the occurrence of higher harmonic waves and the occurrence of an unnecessary radiation noise can be reliably suppressed.

It is preferred that the control circuit comprises:
a first driving cell comprising
a first-conductive-type MOS transistor of a strong driving performance, connected with a terminal of a source level, for controlling the output-stage first-conductive-type transistor to be controlled to the turn-off condition, which is arranged between the terminal of the source level and the output terminal, according to the input signal received in the input terminal so as to be immediately controlled to the turn-off condition; and
a second-conductive-type MOS transistor of a weak driving performance, connected with a terminal of a reference level and complementarily operated with the first-conductive-type MOS transistor, for controlling the output-stage first-conductive-type transistor, which is to be controlled to the turn-on condition, so as to be gradually turned on according to the input signal received in the input terminal,
a second driving cell comprising
a second-conductive-type MOS transistor of a strong driving performance, connected with the terminal of the reference level, for controlling the output-stage second-conductive-type transistor to be controlled to the turn-off condition, which is arranged between the terminal of the reference level and the output terminal, according to the input signal received in the input terminal so as to be immediately controlled to the turn-off condition; and
a first-conductive-type MOS transistor of a weak driving performance, connected with the terminal of the source level and complementarily operated with the second-conductive-type MOS transistor, for controlling the output-stage second-conductive-type transistor, which is to be controlled to the turn-on condition, so as to be gradually turned on according to the input signal received in the input terminal, and
a through rate correcting circuit for controlling the output-stage second-conductive-type MOS transistor to be turned on at the turning-on speed, at which the through rate of the output signal output to the output terminal is set within the prescribed range, in the beginning period, in which the output-stage second-conductive-type MOS transistor is controlled by the second driving cell to be gradually turned on, and controlling the output-stage first-conductive-type MOS transistor to be turned on at the turning-on speed, at which the through rate of the output signal output to the output terminal is set within the prescribed range, in the beginning period, in which the output-stage first-conductive-type MOS transistor is controlled by the first driving cell to be gradually turned on.

The output-stage second-conductive-type MOS transistor and the output-stage first-conductive-type MOS transistor to be controlled to the turn-on condition are controlled by the first and second driving cells to reduce the higher harmonic waves of the output signal, so that the occurrence of an unnecessary radiation noise based on the output signal can be suppressed.

Also, because the output-stage second-conductive-type MOS transistor and the output-stage first-conductive-type MOS transistor to be controlled to the turn-on condition are controlled by the through rate correcting circuit to set the through rate of the output signal within the prescribed range, the through rate of the output signal is set within the prescribed range. Also, even though a pull-up resistor or a pull-down resistor is arranged as the external load, a difference between a rise time and a fall time in the output signal is reduced.

Also, even though the logic device is used as a differential device to output a differential signal as the output signal, a cross point of waveforms of two differential signals can be set within a prescribed range, and a ratio of through rates in the differential signals can be set within a prescribed range.

It is preferred that the through rate correcting circuit comprises:
a second-conductive-type MOS transistor of a middle driving performance, arranged between a gate of the output-stage second-conductive-type MOS transistor and the terminal of the source level, for controlling the output-stage second-conductive-type transistor according to an inverted signal of the input signal received at the input terminal to be turned on at the turning-on speed, at which the through rate of the output signal output to the output terminal is set within the prescribed range, in the beginning period in which the output-stage second-conductive-type MOS transistor is controlled by the second driving cell to be gradually turned on; and
a first-conductive-type MOS transistor of a middle driving performance, arranged between a gate of the output-stage first-conductive-type MOS transistor and the terminal of the reference level, for controlling the output-stage first-conductive-type transistor according to the inverted signal of the input signal received at the input terminal to be turned on at the turning-on speed, at which the through rate of the output signal output to the output terminal is set within the prescribed range, in the beginning period in which the output-stage first-conductive-type MOS transistor is controlled by the first driving cell to be gradually turned on.

Therefore, the through rate correcting circuit sets the through rate of the output signal output to the output terminal within the prescribed range. Also, even though a pull-up resistor or a pull-down resistor is arranged as the external load, a difference between a rise time and a fall time in the output signal is reduced.

Also, even though the logic device is used as a differential device to output a differential signal as the output signal, a cross point of waveforms of two differential signals can be set within a prescribed range, and a ratio of through rates in the differential signals can be set within a prescribed range.

It is preferred that the logic device further comprises a manufacturing error correcting circuit for correcting a ratio of a rise time to a fall time in the output signal output to the output terminal to set the ratio within a prescribed range regardless of a driving performance difference between a group of first-conductive-type MOS transistors and a group of second-conductive-type MOS transistors caused by manufacturing errors.

Therefore, even though a driving performance difference between a group of first-conductive-type MOS transistors and a group of second-conductive-type MOS transistors occurs because manufacturing errors occur in the group of first-conductive-type MOS transistors and the group of second-conductive-type MOS transistors, a ratio of a rise time to a fall time in the output signal can be set within a prescribed range.

It is preferred that the manufacturing error correcting circuit comprises:

a manufacturing error correcting second-conductive-type MOS transistor, connected with the output-stage first-conductive-type MOS transistor in parallel to each other and cooperated with the output-stage first-conductive-type MOS transistor; and a manufacturing error correcting first-conductive-type MOS transistor, connected with the output-stage second-conductive-type MOS transistor in parallel to each other, cooperated with the output-stage second-conductive-type MOS transistor and complementarily operated with the manufacturing error correcting second-conductive-type MOS transistor.

In the above configuration, in cases where the driving performance of the group of first-conductive-type MOS transistors differs from a desired driving performance, the rise time of the output signal is lengthen. Therefore, the rise time is corrected by the manufacturing error correcting second-conductive-type MOS transistor manufactured to have the desired driving performance. In contrast, in cases where the driving performance of the group of second-conductive-type MOS transistors differs from a desired driving performance, the fall time of the output signal is lengthen. Therefore, the fall time is corrected by the manufacturing error correcting first-conductive-type MOS transistor manufactured to have the desired driving performance.

Accordingly, the ratio in the output-stage first-conductive-type MOS transistor can be reliably set within a prescribed range, and the ratio in the output-stage second-conductive-type MOS transistor can be reliably set within a prescribed range.

The main object is also achieved by the provision of a logic device, comprising:

a control circuit having a pair of first-stage output transistors, which are complementarily operated with each other and are controlled according to an inverted signal which is obtained by inverting an input signal received at an input terminal and has a strong driving performance, for outputting an output signal corresponding to the input signal to an output terminal and charging or discharging an output load; and a pair of second-stage output transistors, which respectively have a driving performance stronger than that of the first-stage output transistors and are complementarily operated with each other, for performing an operation in parallel to the operation of the first-stage output transistors and correcting a through rate of the output signal output from the first-stage output transistors to the output terminal, wherein one second-stage output transistor, which is to be controlled to a turn-off condition, is controlled according to the input signal and a delayed input signal obtained by delaying the input signal to be immediately turn off by a transistor of a strong driving performance, and the other second-stage output transistor, which is to be controlled to a turn-on condition, is controlled according to the input signal and the delayed input signal to be turned on in a latter period changing to the turn-on condition while successively and smoothly controlling the other second-stage output transistor at first by a transistor of a weak driving performance and controlling the other second-stage output transistor at a turning-on speed at which the through rate is set within a prescribed range.

Therefore, because the second-stage output transistor to be controlled to the turn-on condition is smoothly turned on by the transistor of the weak driving performance at first, the occurrence of higher harmonic waves based on an uneven level change of a signal can be suppressed, and the occurrence of an unnecessary radiation noise can be suppressed. Thereafter, because the second-stage output transistor having a driving performance stronger that that of the first-stage output transistor is turned on to set the through rate within the prescribed range, even though a pull-up resistor or a pull-down resistor is arranged as the external load, a difference between a rise time and a fall time in the output signal can be reduced.

Also, even though the logic device is used as a differential device to output a differential signal as the output signal, a cross point-of waveforms of two differential signals can be set within a prescribed range, and a ratio of through rates in the differential signals can be set within a prescribed range.

It is preferred that the first-stage output transistors are a first-stage output first-conductive-type MOS transistor, which is connected with a terminal of a source voltage, and a first-stage output second-conductive-type MOS transistor, which is connected with a terminal of a reference voltage, complementarily operated with each other, the second-stage output transistors are a second-stage output first-conductive-type MOS transistor, which is connected with the terminal of the source voltage, and a second-stage output second-conductive-type MOS transistor, which is connected with the terminal of the reference voltage, complementarily operated with each other, and the control circuit comprises a first driving cell comprising:

a first-conductive-type MOS transistor of a strong driving performance for controlling the second-stage output first-conductive-type transistor, which is to be controlled to the turn-off condition, to be immediately turned off according to the delayed input signal; and a second-conductive-type MOS transistor of a weak driving performance, complementarily operated with the first-conductive-type MOS transistor, for controlling the second-stage output first-conductive-type transistor, which is to be controlled to the turn-on condition, to be successively and smoothly turned on in the latter period changing to the turn-on condition at the turning-on speed at which the through rate is set within the prescribed range, and a second driving cell comprising:
   a second-conductive-type MOS transistor of a strong driving performance for controlling the second-stage output second-conductive-type transistor, which is to be controlled to the turn-off condition, to be immediately turned off according to the delayed input signal; and
   a first-conductive-type MOS transistor of a weak driving performance, complementarily operated with the second-conductive-type MOS transistor, for controlling the second-stage output second-conductive-type transistor, which is to be controlled to the turn-on condition, to be successively and smoothly turned on in the latter period changing to the turn-on condition at the turning-on speed at which the through rate is set within the prescribed range.

Therefore, the higher harmonic waves of the output signal can be suppressed by the second-stage output first-conductive-type transistor and the second-stage output second-conductive-type transistor controlled to be turn on by transistors of the weak driving performance arranged in the first and second driving cells, the through rate of the output signal can be set within the prescribed range.

Also, because the driving performance of the second-stage output first-conductive-type transistor and the second-stage output second-conductive-type transistor, which is stronger than that of the first-stage output first-conductive-type transistor and the first-stage output second-conductive-type transistor, is sufficient to influence on the external load. Therefore, even though a pull-up resistor or a pull-down resistor is arranged as the external load, a difference between a rise time and a fall time in the output signal can be reduced.

Also, even though the logic device is used as a differential device to output a differential signal as the output signal, a cross point of waveforms of two differential signals can be set within a prescribed range, and a ratio of through rates in the differential signals can be set within a prescribed range.

It is preferred that the control circuit further comprises:
   an AND gate for producing a first driving signal from the input signal and the delayed input signal according to an AND logic and transmitting the first driving signal to a gate of the first-conductive-type MOS transistor of the first driving cell and a gate of the second-conductive-type MOS transistor of the first driving cell, the first driving signal performing a first level change in response to a first level change of the input signal and performing a second level change in response to a second level change of the delayed input signal; and
   an OR gate for producing a second driving signal from the input signal and the delayed input signal according to an OR logic and transmitting the second driving signal to a gate of the first-conductive-type MOS transistor of the second driving cell and a gate of the second-conductive-type MOS transistor of the second driving cell, the second driving signal performing the second level change in response to the second level change of the input signal and performing the first level change in response to the first level change of the delayed input signal.

In the above configuration, when the level of the input signal is suddenly lowered to the low level (the first level change), the first driving signal lowered to the low level in response to the input signal is output from the AND gate, and the second driving signal lowered to the low level in response to the delayed input signal is output from the OR gate. In contrast, when the level of the input signal is suddenly heightened to the high level (the second level change), the first driving signal heightened to the high level in response to the delayed input signal is output from the AND gate, and the second driving signal heightened to the high level in response to the input signal is output from the OR gate. Therefore, the second-stage output signal gradually level-changing in the second half period of the level change of the second-stage output signal is output from a second-stage output circuit of the second-stage output transistors.

Accordingly, the output signal can be produced while setting a through rate of the output signal within a prescribed range. Also, the occurrence of higher harmonic waves based on an uneven level change of a signal can be suppressed, and the occurrence of an unnecessary radiation noise can be suppressed.

DETAILED DESCRIPTION OF THE PREFERRED EMBODIMENTS

The invention will now be described with reference to the accompanying drawings.

Embodiment 1

Figure 1:
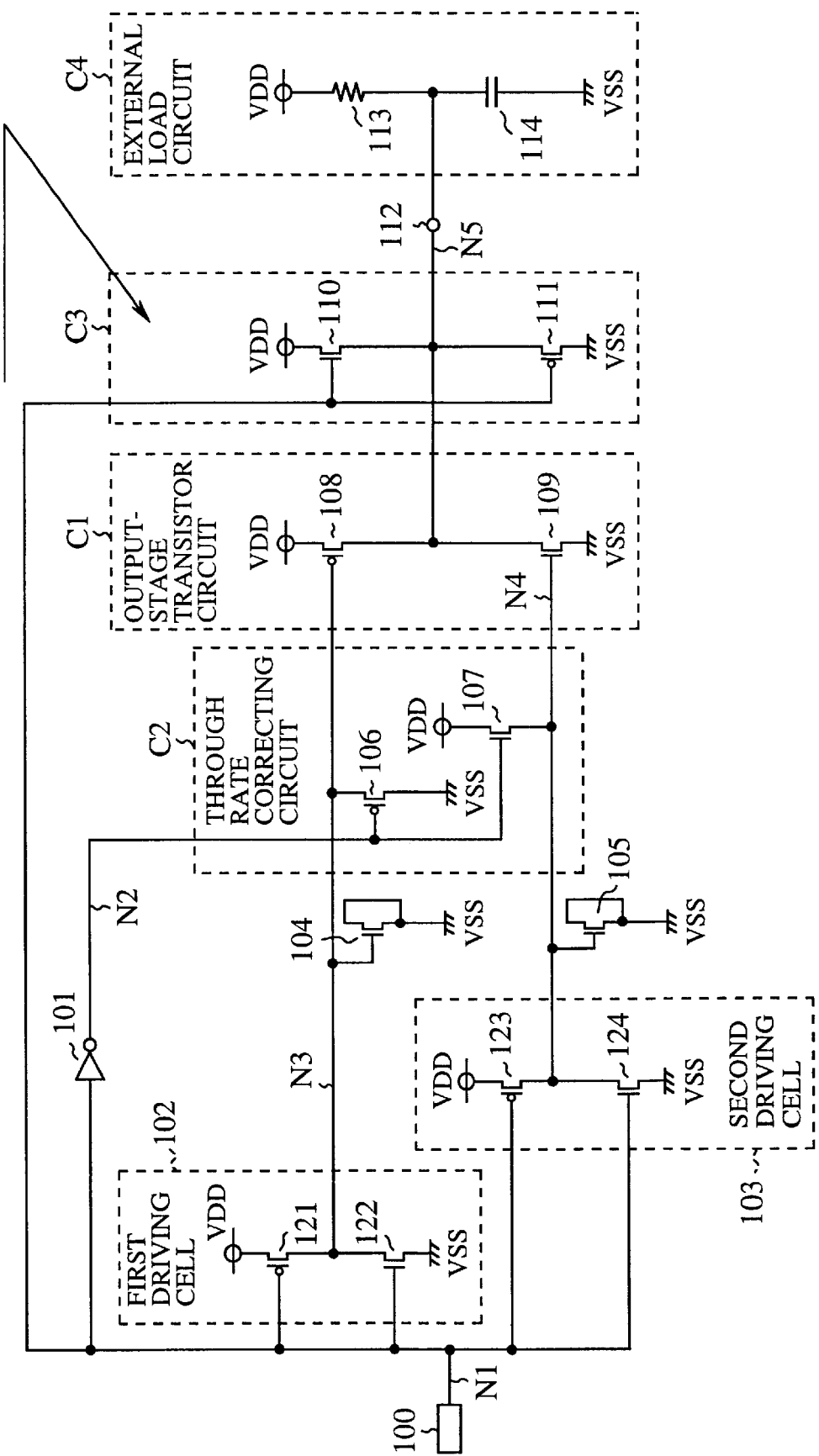
FIG. 1 is a circuit diagram showing the configuration of an output buffer device representing a logic device according to a first embodiment of the present invention.

FIG. 1 is a circuit diagram showing the configuration of an output buffer device representing a logic device according to a first embodiment of the present invention.

As shown in FIG. 1, a reference numeral 100 denotes an input terminal 100, a reference numeral 112 denotes an output terminal, and a reference numeral 101 denotes an inverter circuit for receiving an input signal from the input terminal 100, inverting the level of the input signal and transmitting an inverted input signal through a node N2.

A reference numeral 102 denotes a first driving cell (functioning as a control circuit). The first driving cell 102 is composed of a driving p-channel(or first-conductive-type) MOS transistor 121 of a strong driving performance connected with a terminal of a source voltage VDD and a driving n-channel(or second-conductive-type) MOS transistor 122 of a weak driving performance connected with a terminal of a reference level VSS (VSS is equal to the ground voltage of 0 V) and complementarily operated with the driving p-channel MOS transistor 121. The first driving cell 102 receives the input signal from the input terminal 100 through a node N1 at gates of both the driving p-channel MOS transistor 121 and the driving n-channel MOS transistor 122, outputs a first driving signal, in which a level is immediately heightened to the H level, to a node N3 by turning on the driving p-channel MOS transistor 121 when the input signal is changed to the L level and outputs a first driving signal, in which a level is gradually lowered to the L level, to the node N3 by turning on the driving n-channel MOS transistor 122 when the input signal is changed to the H level.

A reference numeral 103 denotes a second driving cell (functioning as the control circuit). The second driving cell 103 is composed of a driving p-channel MOS transistor 123 of a weak driving performance connected with a terminal of the source voltage VDD and a driving n-channel MOS transistor 124 of a strong driving performance connected with a terminal of the reference level VSS and complementarily operated with the driving p-channel MOS transistor 123. The second driving cell 103 receives the input signal at gates of both the driving p-channel MOS transistor 123 and the driving n-channel MOS transistor 124, outputs a second driving signal, in which a level is gradually heightened to the H level, to a node N4 by turning on the driving p-channel MOS transistor 123 when the input signal is changed to the L level and outputs a second driving signal, in which a level is immediately lowered to the L level, to the node N4 by turning on the driving n-channel MOS transistor 124 when the input signal is changed to the H level.

A reference numeral 104 denotes a condenser. The condenser 104 is arranged between the node N3 connected with the first driving cell 102 and a terminal of the reference level VSS. A reference numeral 105 denotes a condenser. The condenser 105 is arranged between the node N4 connected with the second driving cell 103 and a terminal of the reference level VSS.

A reference symbol C1 denotes an output-stage transistor circuit. The output-stage transistor circuit C1 is composed of an output-stage p-channel MOS transistor 108 arranged between a terminal of the source voltage VDD and the output terminal 112 and an output-stage n-channel MOS transistor 109 arranged between a terminal of the reference level VSS and the output terminal 112 and complementarily operated with the output-stage p-channel MOS transistor 108. The output-stage transistor circuit C1 receives the first driving signal transmitting through the node N3 at a gate of the output-stage p-channel MOS transistor 108, receives the second driving signal transmitting through the node N4 at a gate of the output-stage n-channel MOS transistor 109, outputs an output signal, in which a level is gradually lowered to the L level to suppress the occurrence of an unnecessary radiation noise, to the output terminal 112 through a node N5 by immediately turning off the output-stage p-channel MOS transistor 108 and smoothly turning on the output-stage n-channel MOS transistor 109 in cases where the first driving signal immediately heightened to the H level and the second driving signal gradually heightened to the H level are received, and outputs an output signal, in which a level is gradually heightened to the H level to suppress the occurrence of an unnecessary radiation noise, to the output terminal 112 through the node N5 by immediately turning off the output-stage n-channel MOS transistor 109 and smoothly turning on the output-stage p-channel MOS transistor 108 in cases where the first driving signal gradually lowered to the L level and the second driving signal immediately lowered to the L level are received.

A reference symbol C2 denotes a through rate correcting circuit C2. The through rate correcting circuit C2 is composed of a through-rate correcting p-channel MOS transistor 106 of a middle driving performance arranged between the node N3 and a terminal of the reference level VSS and a through-rate correcting n-channel MOS transistor 107 of a middle driving performance arranged between the node N4 and a terminal of the source voltage VDD. The through rate correcting circuit C2 receives the inverted input signal obtained in the inverter circuit 101 at gates of both the through-rate correcting p-channel MOS transistor 106 and the through-rate correcting n-channel MOS transistor 107 through the node N2, controls the output-stage n-channel MOS transistor 109 of the output-stage transistor circuit C1 through the node N4 to be turned on at a turning-on speed, at which the through rate of the output signal output to the output terminal 112 is adjusted within a prescribed range, when the output-stage n-channel MOS transistor 109 starts to be gradually turned on under the control of the second driving cell 103 according to the input signal set to the L level, and controls the output-stage p-channel MOS transistor 108 of the output-stage transistor circuit C1 through the node N3 to be turned on at a turning-on speed, at which the through rate of the output signal output to the output terminal 112 is adjusted within the prescribed range, when the output-stage p-channel MOS transistor 108 starts to be gradually turned on under the control of the first driving cell 102 according to the input signal set to the H level.

A reference symbol C3 denotes a manufacturing error correcting circuit C3. The manufacturing error correcting circuit C3 is composed of an error-correcting n-channel MOS transistor 110 arranged between a terminal of the source voltage VDD and the output terminal 112 and an error-correcting p-channel MOS transistor 111 arranged between a terminal of the reference level VSS and the output terminal 112 and complementarily operated with the error-correcting n-channel MOS transistor 110. The manufacturing error correcting circuit C3 receives the input signal at both a gate of the error-correcting n-channel MOS transistor 110 and a gate of the error-correcting p-channel MOS transistor 111 and controls the output signal output to the output terminal 112 so as to correct manufacturing errors of the transistors in cases where the driving performance of the transistors differs from a desired driving performance.

A reference symbol C4 denotes an external load circuit functioning as an external load for the output buffer circuit. The external load circuit C4 is composed of a pull-up resistor 113 arranged between a terminal of the source voltage VDD and the output terminal 112 and a condenser 114 arranged between a terminal of the reference level VSS and the output terminal 112. The signal output to the output terminal 112 is used to charge or discharge the external load circuit C4.

The transistors 121 and 124 respectively have a channel length L and a channel width W satisfying a high ratio W/L, so that the driving performance of the transistors 121 and 124 becomes high. In contrast, the transistors 122 and 123 respectively have a channel length L and a channel width w satisfying a low ratio W/L, so that the driving performance of the transistors 122 and 123 becomes low. Therefore, the driving performance of the first driving cell 102 is high when a first driving signal of the H level is output, the driving performance of the first driving cell 102 is low when a first driving signal of the L level is output, the driving performance of the second driving cell 103 is high when a second driving signal of the L level is output, and the driving performance of the second driving cell 103 is low when a second driving signal of the H level is output. Also, the transistors 106 and 107 respectively have a channel length L and a channel width W satisfying a moderate ratio W/L, so that the transistors 106 and 107 respectively have the middle driving performance between the high driving performance and the low driving performance.

In the manufacturing error correcting circuit C3, even though the error-correcting n-channel MOS transistor 110 is turned on by receiving the input signal of the H level, the output terminal 112 does not reach the H level. Also, even though the error-correcting p-channel MOS transistor 111 is turned on by receiving the input signal of the L level, the output terminal 112 does not reach the H level.

In the above configuration, an operation of the output buffer device is described with reference to FIG. 2 and FIG. 3.

Figure 2:
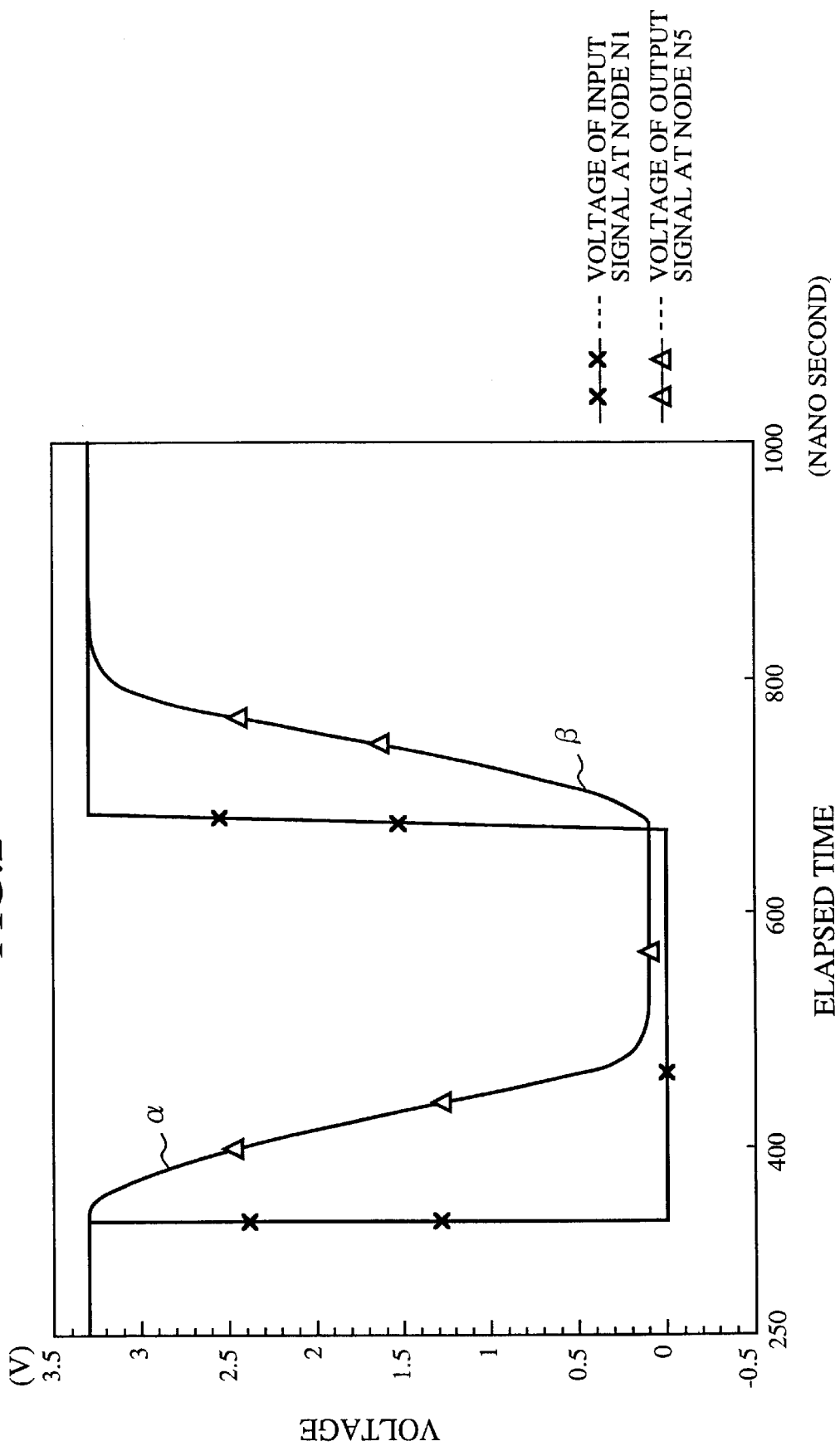
FIG. 2 is a waveform diagram showing a waveform of an input signal and a waveform of an output signal.
Figure 3:
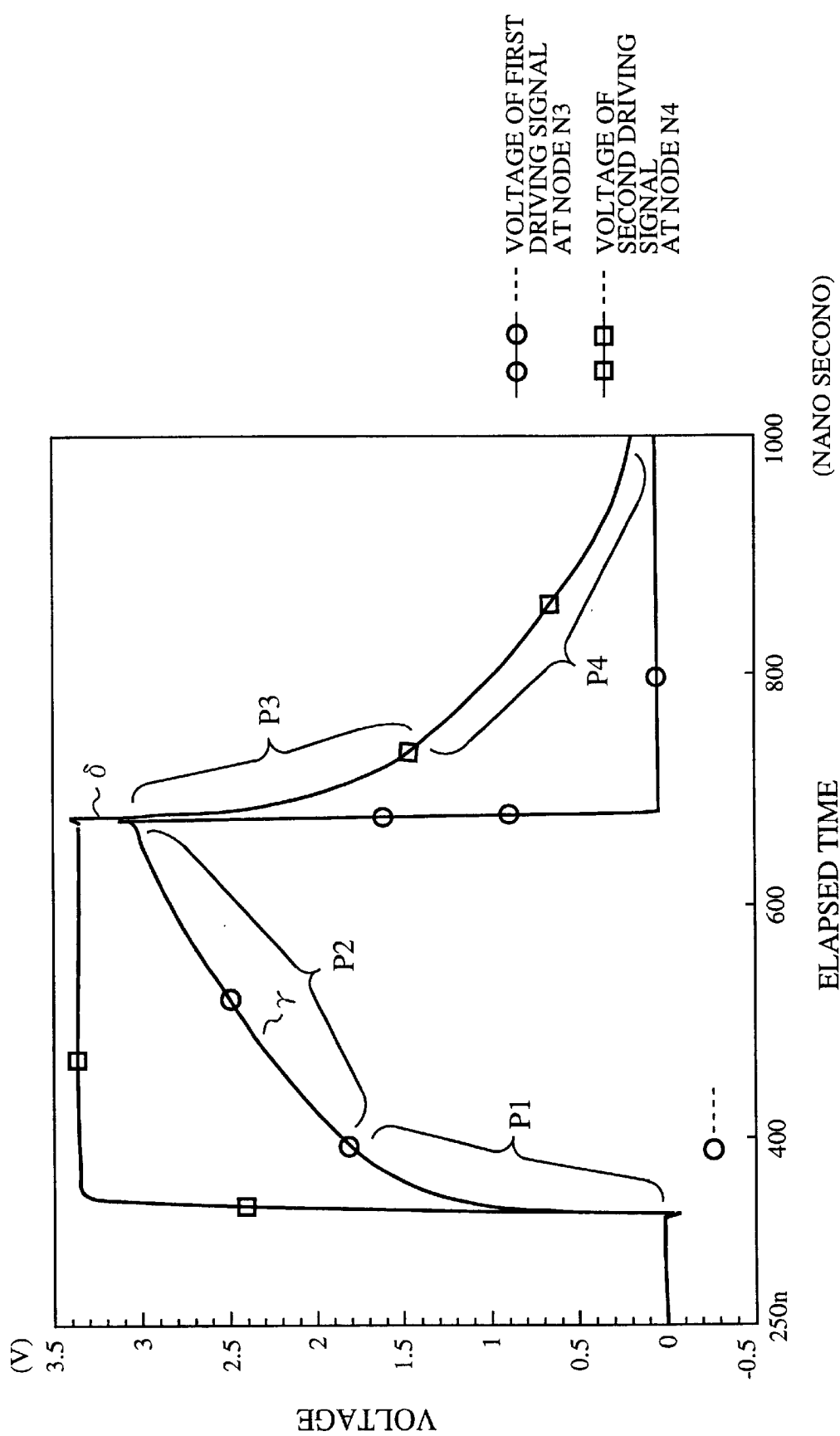
FIG. 3 is a waveform diagram showing a waveform of a first driving signal and a waveform of a second driving signal.

FIG. 2 is a waveform diagram showing a waveform of an input signal transmitting through the node N1 and a waveform of an output signal transmitting through the node N5, and FIG. 3 is a waveform diagram showing a waveform of a first driving signal transmitting through the node N3 and a waveform of a second driving signal transmitting through the node N4. In FIG. 2, a line connecting symbols X indicates a voltage waveform of the input signal, and a line connecting symbols Δ indicates a voltage waveform of the output signal. Also, in FIG. 3, a line connecting symbols □ indicates a voltage waveform of the first driving signal, and a line connecting symbols ○ indicates a voltage waveform of the second driving signal.

An operation performed when the input signal is changed from the H level to the L level in a fall time is initially described.

When the input signal is set to the H level as an initial condition, in the first driving cell 102, the driving p-channel MOS transistor 121 is set to the "off" condition, and the driving n-channel MOS transistor 122 is set to the "on" condition to electrically connect the node N3 with the ground set to the reference level VSS=0. Therefore, the node N3 is set to the L level. Also, in the second driving cell 103, the driving p-channel MOS transistor 123 is set to the "off" condition, and the driving n-channel MOS transistor 124 is set to the "on" condition to electrically connect the node N4 with the ground. Therefore, the node N4 is set to the L level. Also, in the through rate correcting circuit C2, because the node N2 is set to the L level by the inverter circuit 101, the through-rate correcting p-channel MOS transistor 106 is set to the "on" condition, and the through-rate correcting n-channel MOS transistor 107 is set to the "off" condition. Also, in the output-stage transistor circuit C1, the output-stage p-channel MOS transistor 108 is set to the "on" condition because the node N3 is set to the L level, and the output-stage n-channel MOS transistor 109 is set to the "off" condition because the node N4 is set to the L level. Also, in the manufacturing error correcting circuit C3, because the input signal set to the H level is received at the gates of both the error-correcting n-channel MOS transistor 110 and the error-correcting p-channel MOS transistor 111, the error-correcting n-channel MOS transistor 110 is set to the "on" condition, and the error-correcting p-channel MOS transistor 111 is set to the "off" condition.

As a result, because the output-stage p-channel MOS transistor 108 is set to the "on" condition, the output terminal 112 is set to the H level which is the same as that of the input signal.

Thereafter, when the level of the input signal is suddenly changed to the L level to turn on the driving p-channel MOS transistor 121 of the first driving circuit 102 and the driving p-channel MOS transistor 123 of the second driving circuit 103 and to turn off the driving n-channel MOS transistor 122 of the first driving circuit 102 and the driving n-channel MOS transistor 124 of the second driving circuit 103, because the driving p-channel MOS transistor 121 has the high driving performance, as shown in FIG. 3, a first driving signal at the node N3 is immediately and sharply heightened to the H level even though a charge applied to the node N3 through the driving p-channel MOS transistor 121 is sent to the condenser 104.

Also, in the through rate correcting circuit C2, because an inverted input signal at the node N2 is immediately and sharply changed to the H level by the inverter circuit 101, the through-rate correcting n-channel MOS transistor 107 is immediately and sharply turned on. Therefore, as shown in FIG. 3, a second driving signal at the node N4 is immediately and sharply heightened in a beginning period of the level change of the second driving signal, but the through-rate correcting n-channel MOS transistor 107 is designed for the second driving signal not to reach the H level at the node N4. Also, in contrast to the driving p-channel MOS transistor 121, because the driving p-channel MOS transistor 123 of the second driving cell 123 has the low driving performance and because the condenser 105 is connected with the node N4, as shown in FIG. 3, the node N4 and the condenser 105 is gradually charged through the driving p-channel MOS transistor 123 during the level change of the second driving signal, so that the second driving signal at the node N4 is gradually heightened in a transition period following the beginning period of the level change of the second driving signal, and the second driving signal at the node N4 finally reaches the H level.

Therefore, the second driving signal at the node N4 is heightened to the H level according to the cooperation of the through-rate correcting n-channel MOS transistor 107 of the through rate correcting circuit C2 and the driving p-channel MOS transistor 123 of the second driving cell 103. In detail, the second driving signal at the node N4 is immediately and sharply heightened by the through-rate correcting n-channel MOS transistor 107 just after the input signal is suddenly changed to the L level, and the second driving signal at the node N4 is gradually heightened to the H level by the driving p-channel MOS transistor 123 in the transition period after the sharp level change of the second driving signal based on the through-rate correcting n-channel MOS transistor 107.

Therefore, as shown in FIG. 3, because the sharp level change of the second driving signal in the beginning period is smoothly succeeded by the gradual level change in the transition period, the level of the second driving signal at the node N4 is smoothly changed in the entire level change period of the second driving signal. That is, a voltage waveform γ of the second driving signal at the node N4 has both a sharply raising-up portion (P1) placed just after the sudden level change of the input signal and a gradually raising-up portion (P2) smoothly connected with the sharply raising-up portion (P1).

In the output-stage transistor circuit C1, the output-stage p-channel MOS transistor 108 is immediately and sharply turned off just after the sudden level change of the input signal because the first driving signal at the node N3 is immediately and sharply changed to the H level by the driving p-channel MOS transistor 121 of the first driving cell 102. In contrast, the output-stage n-channel MOS transistor 109 is immediately and sharply turned on in a beginning period of the condition change of the output-stage n-channel MOS transistor 109 and is gradually turned on at the transitional period which follows the beginning period and is continued until the output-stage n-channel MOS transistor 109 reaches a steady condition.

Also, in the manufacturing error correcting circuit C3, the error-correcting n-channel MOS transistor 110 is immediately and sharply turned off according to the input signal just after the sudden level change of the input signal, and the error-correcting p-channel MOS transistor 111 is immediately and sharply turned on according to the input signal just after the sudden level change of the input signal. In this case, though the level of the node N5 is lowered by the cooperation of the output-stage n-channel MOS transistor 109 and the error-correcting p-channel MOS transistor 111, the error-correcting p-channel MOS transistor 111 is designed for the node N5 not to reach the L level by the operation of only the error-correcting p-channel MOS transistor 111.

Therefore, as shown in FIG. 2, the level of an output signal at the node N5 is immediately and sharply lowered in the beginning period of the level change of the node N5 because of both the second driving signal at the node N4, of which the level is immediately and sharply changed just after the sudden level change of the input signal, and the immediate sharp turning-on of the error-correcting p-channel MOS transistor 111. Also, the level of the output signal at the node N5 is gradually lowered at the transition period of the level change of the output signal because the output-stage n-channel MOS transistor 109 is gradually turned on according to the gradual level change of the second driving signal at the node N4 at the transition period of the condition change of the output-stage n-channel MOS transistor 109, and the output signal at the node N5 finally reaches the L level. In this case, because the level of the second driving signal at the node N4 is smoothly changed in the entire level change period, the level of the output signal at the node N5 is smoothly changed in the entire level change period, so that there is no opportunity for unevenly changing the level of the output signal at the node N5 during the level change of the output signal. That is, as shown in FIG. 2, a voltage waveform α of the signal output to the output terminal 112 has no uneven portion during the level change of the output signal.

Accordingly, when the input signal is suddenly changed to the L level, because the level of the output signal transmitted from the output terminal 112 to the external load circuit C4 is not unevenly changed but is smoothly changed, an operation can be performed in the external load circuit C4 according to the output signal while suppressing the occurrence of any unnecessary radiation noise.

Next, an operation performed when the input signal is suddenly changed from the L level to the H level in its rise time is described.

When the input signal is set to the L level as an initial condition, in the first driving cell 102, the driving p-channel MOS transistor 121 is set to the "on" condition to electrically connect the node N3 with the terminal of the source voltage VDD, and the driving n-channel MOS transistor 122 is set to the "off" condition. Therefore, the node N3 is set to the H level. Also, in the second driving cell 103, the driving p-channel MOS transistor 123 is set to the "on" condition to electrically connect the node N4 with the terminal of the source voltage VDD, and the driving n-channel MOS transistor 124 is set to the "off" condition. Therefore, the node N4 is set to the H level. Also, in the through rate correcting circuit C2, because the node N2 is set to the H level by the inverter circuit 101, the through-rate correcting p-channel MOS transistor 106 is set to the "off" condition, and the through-rate correcting n-channel MOS transistor 107 is set to the "on" condition. Also, in the output-stage transistor circuit C1, the output-stage p-channel MOS transistor 108 is set to the "off" condition because the node N3 is set to the H level, and the output-stage n-channel MOS transistor 109 is set to the "on" condition because the node N4 is set to the H level. Also, in the manufacturing error correcting circuit C3, because the input signal set to the L level is received at the gates of both the error-correcting n-channel MOS transistor 110 and the error-correcting p-channel MOS transistor 111, the error-correcting n-channel MOS transistor 110 is set to the "off" condition, and the error-correcting p-channel MOS transistor 111 is set to the "on" condition.

As a result, because the output-stage n-channel MOS transistor 109 is set to the "on" condition, the output terminal 112 is set to the L level which is the same as that of the input signal.

Thereafter, when the level of the input signal is suddenly changed to the H level to turn on the driving n-channel MOS transistor 122 of the first driving circuit 102 and the driving n-channel MOS transistor 124 of the second driving circuit 103 and to turn off the driving p-channel MOS transistor 121 of the first driving circuit 102 and the driving p-channel MOS transistor 123 of the second driving circuit 103, because the driving n-channel MOS transistor 124 has the high driving performance, as shown in FIG. 3, the second driving signal at the node N4 is immediately and sharply lowered to the L level.

Also, in the through rate correcting circuit C2, because the inverted input signal at the node N2 is immediately and sharply changed to the L level by the inverter circuit 101, the through-rate correcting p-channel MOS transistor 106 is immediately and sharply turned on. Therefore, as shown in FIG. 3, the level of the first driving signal at the node N3 is immediately and sharply lowered in a beginning period of the level change of the first driving signal, but the through-rate correcting p-channel MOS transistor 106 is designed for the first driving signal not to reach the L level. Also, in contrast to the driving n-channel MOS transistor 124, because the driving n-channel MOS transistor 122 of the first driving cell 122 has the low driving performance and because the condenser 104 is connected with the node N3, as shown in FIG. 3, a charge of the node N3 and the condenser 104 is gradually discharged to the ground through the driving n-channel MOS transistor 122 during the level change of the first driving signal, so that the level of the first driving signal at the node N3 is gradually lowered in a transition period after the level of the first driving signal at the node N3 is immediately and sharply lowered by the through-rate correcting p-channel MOS transistor 106 in the beginning period, and the first driving signal at the node N3 finally reaches the L level.

Therefore, the first driving signal at the node N3 is lowered to the L level according to the cooperation of the through-rate correcting p-channel MOS transistor 106 of the through rate correcting circuit C2 and the driving n-channel MOS transistor 122 of the first driving cell 102. In detail, the level of the first driving signal at the node N3 is immediately and sharply lowered by the through-rate correcting p-channel MOS transistor 106 just after the input signal is suddenly changed to the H level, and the first driving signal at the node N3 is gradually lowered to the L level by the driving n-channel MOS transistor 122 in the transition period after the sharp level change of the first driving signal based on the through-rate correcting p-channel MOS transistor 106.

Therefore, as shown in FIG. 3, because the sharp level change of the first driving signal in the beginning period is smoothly succeeded by the gradual level change of the first driving signal in the transition period, the level of the first driving signal at the node N3 is smoothly changed in the entire level change period of the first driving signal. That is, a voltage waveform δ of the first driving signal transmitting through the node N3 has both a sharply falling-down portion (P3) placed just after the sudden level change of the input signal and a gradually falling-down portion (P4) smoothly connected with the sharply falling-down portion (P3).

In the output-stage transistor circuit C1, the output-stage n-channel MOS transistor 109 is immediately and sharply turned off just after the sudden level change of the input signal because the second driving signal at the node N4 is immediately and sharply changed to the L level by the driving n-channel MOS transistor 124 of the second driving cell 103. In contrast, the output-stage p-channel MOS transistor 108 is immediately and sharply turned on in a beginning period of the condition change of the output-stage p-channel MOS transistor 108 and is gradually turned on in a transition period of the condition change of the output-stage p-channel MOS transistor 108.

Also, in the manufacturing error correcting circuit C3, the error-correcting p-channel MOS transistor 111 is immediately and sharply turned off according to the input signal just after the sudden level change of the input signal, and the error-correcting n-channel MOS transistor 110 is immediately and sharply turned on according to the input signal just after the sudden level change of the input signal. In this case, though the level of the node N5 is heightened by the cooperation of the output-stage p-channel MOS transistor 108 and the error-correcting n-channel MOS transistor 110, the error-correcting n-channel MOS transistor 110 is designed for the node N5 not to reach the H level by the operation of only the error-correcting n-channel MOS transistor 110.

Therefore, as shown in FIG. 2, the level of the output signal at the node N5 is immediately and sharply heightened in the beginning period of the level change of the output signal because of both the first driving signal at the node N3, of which the level is changed immediately and sharply just after the sudden level change of the input signal, and the immediate sharp turning-on of the error-correcting n-channel MOS transistor 110.

Also, the level of the output signal at the node N5 is gradually heightened in the transition period of the level change of the output signal because the output-stage p-channel MOS transistor 108 is gradually turned on according to the gradual level change of the first driving signal at the node N3 in the transition period of the condition change of the output-stage p-channel MOS transistor 108, and the output signal at the node N5 finally reaches the H level. In this case, because the level of the first driving signal at the node N3 is smoothly changed in the entire level change period, the level of the output signal at the node N5 is smoothly changed in the entire level change period, so that there is no opportunity for unevenly changing the level of the output signal at node N5 during the level change of the output signal. That is, as shown in FIG. 2, a voltage waveform β of the signal output to the output terminal 112 has no uneven portion during the level change of the output signal.

Accordingly, when the input signal is suddenly changed to the H level, because the level of the output signal transmitted from the output terminal 112 to the external load circuit C4 is not unevenly changed but is smoothly changed, the external load circuit C4 can be operated according to the output signal while suppressing the occurrence of any unnecessary radiation noise.

Next, the influence of the through-rate correcting p-channel MOS transistor 106 and the through-rate correcting n-channel MOS transistor 107 of the through rate correcting circuit C2 on the output buffer device is described with reference to FIG. 4 and FIG. 5.

Figure 4:
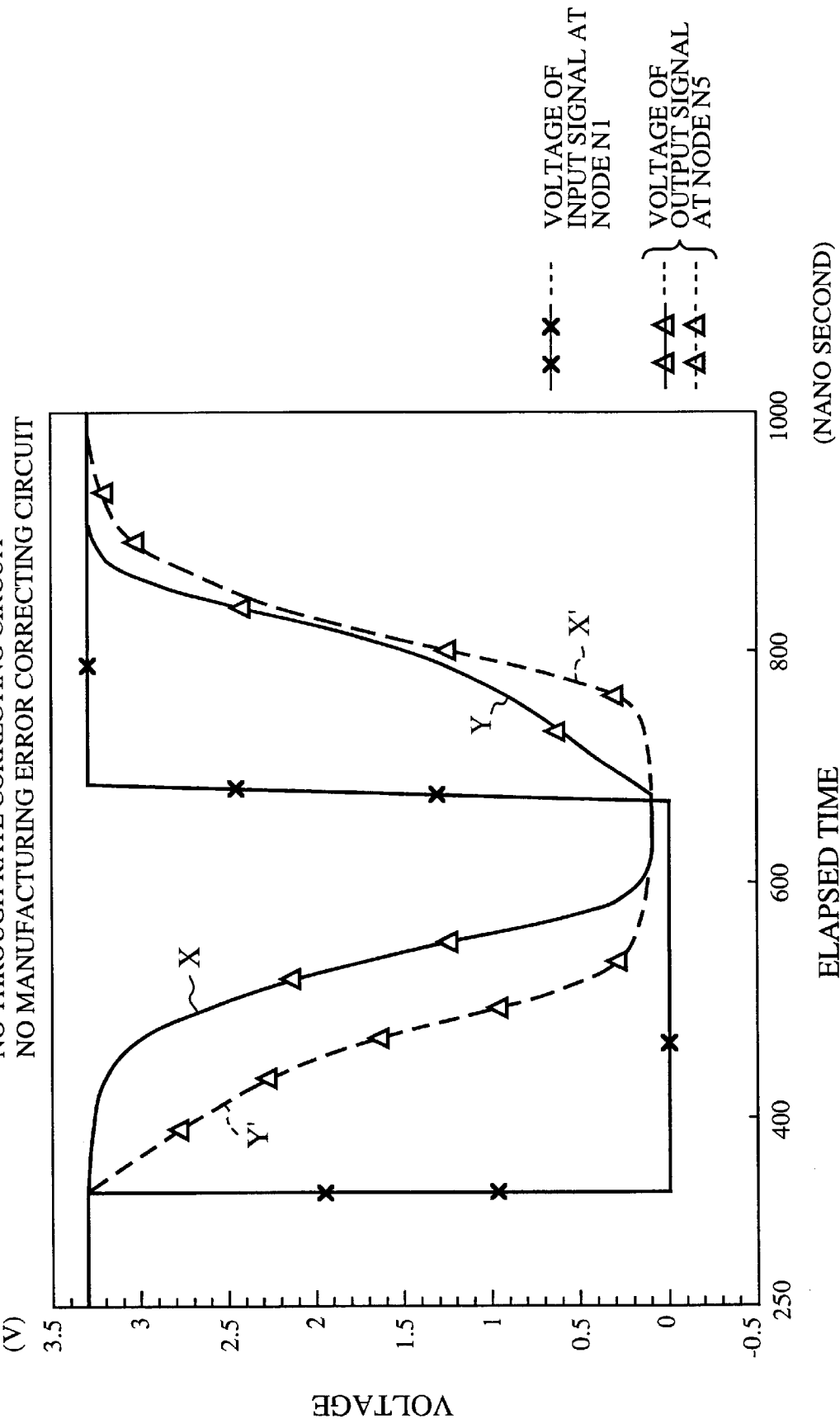
FIG. 4 is a waveform diagram showing a waveform of an input signal transmitting through a node N1, a waveform of an output signal transmitting through a node N5 and a waveform of another output signal transmitting through the node N5 in cases where neither a through rate correcting circuit C2 nor a manufacturing error correcting circuit C3 is arranged in the output buffer device shown in FIG. 1.
Figure 5:
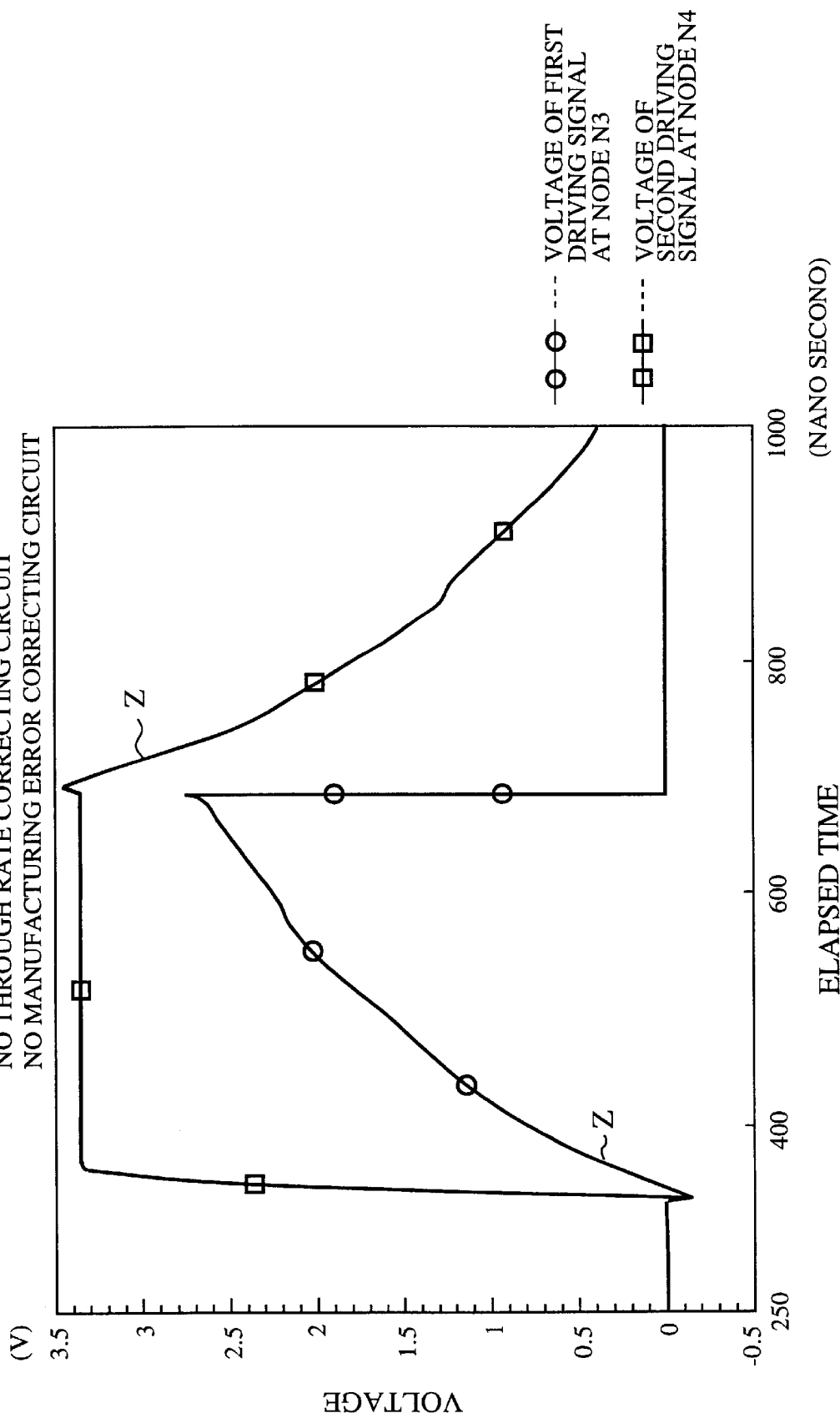
FIG. 5 is a waveform diagram showing a waveform of a first driving signal transmitting through a node N3 and a waveform of a second driving signal transmitting through a node N4 in cases where neither a through rate correcting circuit C2 nor a manufacturing error correcting circuit C3 is arranged in the output buffer device shown in FIG. 1.

FIG. 4 is a waveform diagram showing a waveform of an input signal transmitting through the node N1, a waveform of an output signal transmitting through the node N5 and a waveform of another output signal transmitting through the node N5 in cases where neither the through rate correcting circuit C2 nor the manufacturing error correcting circuit C3 is arranged in the output buffer device, and FIG. 5 is a waveform diagram showing a waveform of a first driving signal transmitting through the node N3 and a waveform of a second driving signal transmitting through the node N4 in cases where neither the through rate correcting circuit C2 nor the manufacturing error correcting circuit C3 is arranged in the output buffer device. In FIG. 4, a line connecting symbols X indicates a voltage waveform of the input signal, a solid line connecting symbols Δ indicates a voltage waveform of the output signal in cases where the pull-up resistor is arranged in the external load circuit C4, and a dotted line connecting symbols Δ indicates a voltage waveform of the output signal in cases where a pull-down resistor is arranged in the external load circuit C4 in place of the pull-up resistor. Also, in FIG. 5, a line connecting symbols □ indicates a voltage waveform of the first driving signal, and a line connecting symbols ○ indicates a voltage waveform of the second driving signal.

As shown in FIG. 4, when the level of the input signal at the node N1 is suddenly fallen down, the level of the output signal at the node N5 is not sharply fallen down but is gradually lowered (refer to a solid line indicated by a symbol X) though the level of the output signal shown in FIG. 2 is sharply fallen down. The reason is as follows. Because the through-rate correcting p-channel MOS transistor 106 and the through-rate correcting n-channel MOS transistor 107 arranged in the through rate correcting circuit C2 and the error-correcting n-channel MOS transistor 110 and the error-correcting p-channel MOS transistor 111 arranged in the manufacturing error. correcting circuit C3 are removed from the output buffer device shown in FIG. 1, the immediate sharp level lowering of the second driving signal based on the through-rate correcting n-channel MOS transistor 107 is not obtained in the beginning period of the level change of the second driving signal, the output-stage n-channel MOS transistor 109 is gradually turned on according to the operation of the driving p-channel MOS transistor 123 of the low driving performance and the condenser 105 connected with the node N4, and the level of the second driving signal at the node N4 is gradually heightened during the entire rise time of the node N4 (refer to FIG. 5).

In contrast, when the level of the input signal at the node N1 is raised up, as shown in FIG. 4, the level of the output signal at the node N5 is sharply raised up in the beginning period of the level change of the output signal(refer to a solid line indicated by a symbol Y). The reason is as follows. The output-stage p-channel MOS transistor 108 of the output-stage transistor circuit C1 is weakly driven in the beginning period of the level change of the output signal because a charge of the node N3 is discharged according to the turning-on of the driving n-channel MOS transistor 122 of the low driving performance, so that the level of the output signal is sharply heightened in the beginning period of the level change of the output signal according to the function of the pull-up resistor 113 of the external load circuit C4 as compared with the level lowering of the output signal.

Also, in cases where a pull-down resistor is arranged in the external load circuit C4 in place of the pull-up resistor 113, when the level of the input signal at the node N1 is fallen down, as shown in FIG. 4, the level of the output signal at the node N5 is sharply fallen down in the beginning period of the level change of the output signal(refer to a solid line indicated by a symbol Y') as compared with a case that the level of the output signal to be output to the external load circuit having the pull-up resistor 113 is lowered. The reason is as follows. The p-channel MOS transistor 109 of the output-stage transistor circuit C1 is weakly driven in the beginning period of the level change of the output signal because the node N4 is charged according to the turning-on of the driving p-channel MOS transistor 123 of the low driving performance, so that the level of the output signal is sharply lowered in the beginning period of the level change of the output signal according to the function of the pull-down resistor of the external load circuit C4.

In contrast, when the level of the input signal at the node N1 is raised up in cases where the pull-down resistor is arranged in the external load circuit C4 in place of the pull-up resistor 113, as shown in FIG. 4, the level of the output signal at the node N5 is not sharply raised up but is gradually heightened (refer to a solid line indicated by a symbol X') as compared with a case that the level of the output signal to be output to the external load circuit having the pull-down resistor is lowered. The reason is as follows. Because the through-rate correcting p-channel MOS transistor 106 and the through-rate correcting n-channel MOS transistor 107 arranged in the through rate correcting circuit C2 and the error-correcting n-channel MOS transistor 110 and the error-correcting p-channel MOS transistor 111 arranged in the manufacturing error correcting circuit C3 are removed from the output buffer device shown in FIG. 1, the immediate sharp level heightening of the first driving signal based on the through-rate correcting p-channel MOS transistor 106 is not obtained in the beginning period of the level change of the first driving signal, the output-stage p-channel MOS transistor 108 is gradually turned on according to the operation of the driving n-channel MOS transistor 122 of the low driving performance and the condenser 104 connected with the node N3, and the level of the first driving signal at the node N3 is gradually lowered during the entire fall time of the node N3 (refer to FIG. 5).

Accordingly, in cases where the through rate correcting circuit C2 is not arranged in the output buffer device, the rise time of the output signal at the node N5 greatly differs from the fall time of the output signal regardless of whether the pull-up resistor 113 or the pull-down resistor is arranged in the external road C4, so that it is difficult to set the rise time of the output signal and the fall time of the output signal within a prescribed through out range.

In this embodiment, because the through rate correcting circuit C2 is arranged in the output buffer device, regardless of whether the pull-up resistor 113 or the pull-down resistor is arranged in the external load circuit C4, when the input signal is suddenly changed to the L level, the level of the second driving signal at the node N4 is immediately and sharply raised up in the beginning period of the level change of the second driving signal by the function of the through-rate correcting n-channel MOS transistor 107, so that the level of the output signal at the node N5 is immediately and sharply fallen down in the beginning period of the level change of the output signal. Also, when the input signal is changed to the H level, the level of the first driving signal at the node N3 is immediately and sharply fallen down in the beginning period of the level change of the first driving signal by the function of the through-rate correcting p-channel MOS transistor 106, so that the level of the output signal at the node N5 is immediately and sharply raised up in the beginning period of the level change of the output signal.

Accordingly, as shown in FIG. 2, the rise time of the output signal and the fall time of the output signal can be set within a prescribed through out range (refer to the voltage waveform indicated by the symbols α and β).

Next, the influence of both the error-correcting n-channel MOS transistor 110 and the error-correcting p-channel MOS transistor 111 arranged in the manufacturing error correcting circuit C3 on the output buffer device is described.

To set a ratio of the output signal rise time to the output signal fall time within a prescribed range, it is desired to manufacture a group of the p-channel MOS transistors 106, 108, 121 and 123 having desired characteristics and a group of the n-channel MOS transistors 107, 109, 111, 122 and 124 having desired characteristics. However, it is assumed that the characteristics of the group of the p-channel MOS transistors and/or the characteristics of the group of the n-channel MOS transistors differ from the desired characteristics because a manufacturing error for the p-channel MOS transistors and/or the n-channel MOS transistors is caused.

To describe the influence of the manufacturing error correcting circuit C3 on the output buffer device, it is assumed that both the error-correcting n-channel MOS transistor 110 and the error-correcting p-channel MOS transistor 111 are removed from the manufacturing error correcting circuit C3. In cases where the group of the p-channel MOS transistors having the desired characteristics and the group of the n-channel MOS transistors having the desired characteristics are manufactured, the rise time and the fall time of the output signal produced in the output-stage transistor circuit C1 are respectively shortened, and a ratio of the rise time to the fall time is set within the prescribed range. Also, in cases where the group of the p-channel MOS transistors and the group of the n-channel MOS transistors are manufactured to have characteristics differing from the desired characteristics in the same manner as each other, the rise time and the fall time of the output signal produced in the output-stage transistor circuit C1 are respectively lengthened, and a ratio of the rise time to the fall time is set within the prescribed range.

However, in cases where the group of the p-channel MOS transistors having the desired characteristics and the group of the n-channel MOS transistors having characteristics differing from the desired characteristics are manufactured, the rise time of the output signal produced in the output-stage transistor circuit C1 is shortened, and the fall time of the output signal produced in the output-stage transistor circuit C1 is lengthened, and a ratio of the rise time to the fall time is set out of the prescribed range. Also, in cases where the group of the p-channel MOS transistors having characteristics differing from the desired characteristics and the group of the n-channel MOS transistors having the desired characteristics are manufactured, the rise time of the output signal produced in the output-stage transistor circuit C1 is lengthened, and the fall time of the output signal produced in the output-stage transistor circuit C1 is shortened, and a ratio of the rise time to the fall time is set out of the prescribed range.

To set a ratio of the output signal rise time to the output signal fall time within the prescribed range, the error-correcting n-channel MOS transistor 110, of which the polarity is the reverse of that of the output-stage p-channel MOS transistor 108, is arranged in parallel to the output-stage p-channel MOS transistor 108 as a transistor influencing on the raising-up of the output signal at the node N5 to correct the manufacturing error caused in the p-channel MOS transistors, and the error-correcting p-channel MOS transistor 111, of which the polarity is the reverse of that of the output-stage n-channel MOS transistor 109, is arranged in parallel to the output-stage n-channel MOS transistor 109 as a transistor influencing on the falling-down of the output signal at the node N5 to correct the manufacturing error caused in the n-channel MOS transistors.

Therefore, in cases where the level of the output signal at the node M5 is heightened, because the output-stage p-channel MOS transistor 108 and the error-correcting n-channel MOS transistor 110 are turned on to cooperate with each other, even though the group of the p-channel MOS transistors having characteristics differing from the desired characteristics and the group of the n-channel MOS transistors having the desired characteristics are manufactured, the manufacturing error caused in the group of the p-channel MOS transistors can be corrected according to the cooperation of the output-stage p-channel MOS transistor 108 and the error-correcting n-channel MOS transistor 110. Also, in cases where the level of the output signal at the node N5 is lowered, because the output-stage n-channel MOS transistor 109 and the error-correcting p-channel MOS transistor 111 are turned on to cooperate with each other, even though the group of the n-channel MOS transistors having characteristics differing from the desired characteristics and the group of the p-channel MOS transistors having the desired characteristics are manufactured, the manufacturing error caused in the group of the p-channel MOS transistors can be corrected according to the cooperation of the output-stage n-channel MOS transistor 109 and the error-correcting p-channel MOS transistor 111. As a result, a ratio of the rise time to the fall time in the output signal can be set within the prescribed range.

Accordingly, in the first embodiment, when the level of the input signal at the node N1 is lowered to the L level, because the level of the second driving signal at the node N4 is immediately and sharply heightened in the beginning period of the level change of the second driving signal by using the through-rate correcting n-channel MOS transistor 107 and because the level of the second driving signal at the node N4 is gradually heightened in the transition period of the level change of the second driving signal by using the driving p-channel MOS transistor 123 and the condenser 105, the level of the output signal can be smoothly and quickly lowered to the L level without any uneven level change according to the operation of the output-stage n-channel MOS transistor 109. Also, when the level of the input signal at the node N1 is heightened to the H level, because the level of the first driving signal at the node N3 is immediately and sharply lowered in the beginning period of the level change of the first driving signal by using the through-rate correcting p-channel MOS transistor 106 and because the level of the first driving signal at the node N3 is gradually heightened in the transition period of the level change of the first driving signal by using the driving n-channel MOS transistor 122 and the condenser 104, the level of the output signal can be smoothly and quickly heightened to the H level without any uneven level change according to the operation of the output-stage p-channel MOS transistor 108. Therefore, the output buffer device, in which the output signal is output within the prescribed through rate range on condition that the occurrence of any unnecessary radiation noise based on the uneven level change of the output signal can be suppressed, can be obtained as the representative of the logic device.

Also, because the error-correcting n-channel MOS transistor 110, of which the polarity is the reverse of that of the output-stage p-channel MOS transistor 108, is arranged in parallel to the output-stage p-channel MOS transistor 108 and because the error-correcting p-channel MOS transistor 111, of which the polarity is the reverse of that of the output-stage n-channel MOS transistor 109, is arranged in parallel to the output-stage n-channel MOS transistor 109, the output-stage n-channel MOS transistor 109 and the error-correcting p-channel MOS transistor 111 are cooperatively turned on when the level of the output signal at the node N5 is lowered, the output-stage p-channel MOS transistor 108 and the error-correcting n-channel MOS transistor 110 are cooperatively turned on when the level of the output signal at the node N5 is heightened. Therefore, even though the characteristics (for example, a driving performance)of the group of the n-channel MOS transistors or the group of the p-channel MOS transistors differ from the desired characteristics in the manufacturing of the transistors, a ratio of the rise time to the fall time in the output signal can be set within the prescribed range, and the output signal can be output within the prescribed range of the through rate.

Also, in cases where the output buffer device is used to produce a differential signal output from a differential amplifier, the output buffer devices, in which a cross point of waveforms of two differential signals and a ratio of through rates in the differential signals are respectively set within a prescribed range, can be obtained.

In the first embodiment, the condenser 104 is arranged to assist the driving n-channel MOS transistor 122 to gradually fall down the level of the first driving signal in the transition period of the level change of the first driving signal when the level of the input signal is heightened to the H level. Therefore, the condenser 104 is not necessarily required on condition that the level of the output signal at the node N5 is smoothly heightened. Also, the condenser 105 is arranged to assist the driving p-channel MOS transistor 123 to gradually raise up the level of the second driving signal in the transition period of the level change of the second driving signal when the level of the input signal is lowered to the H level. Therefore, the condenser 105 is not necessarily required on condition that the level of the output signal at the node N5 is smoothly lowered.

Also, the output buffer device is described as the representative of the logic device. However, in cases where one or more inverters, of which the number is odd, are arranged in the node N1, an inverter device representing the logic device can be obtained. Also, in cases where a plurality of gate circuits such as an AND circuit, an OR circuit and the like are arranged in the node N1, a gate device representing the logic device can be obtained.

Embodiment 2

Figure 6:
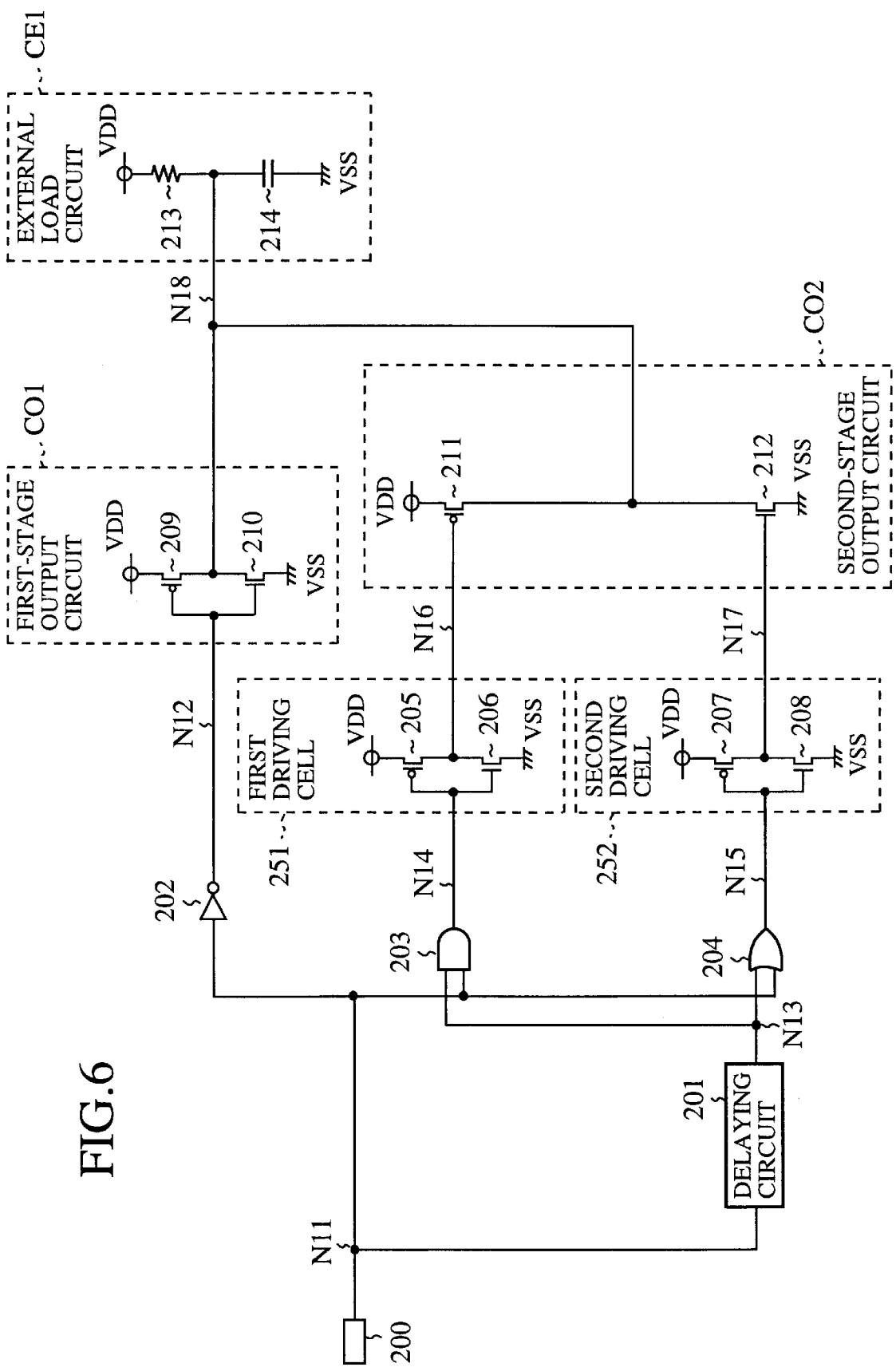
FIG. 6 is a circuit diagram showing the configuration of an output buffer device representing a logic device according to a second embodiment of the present invention.
Figure 7:
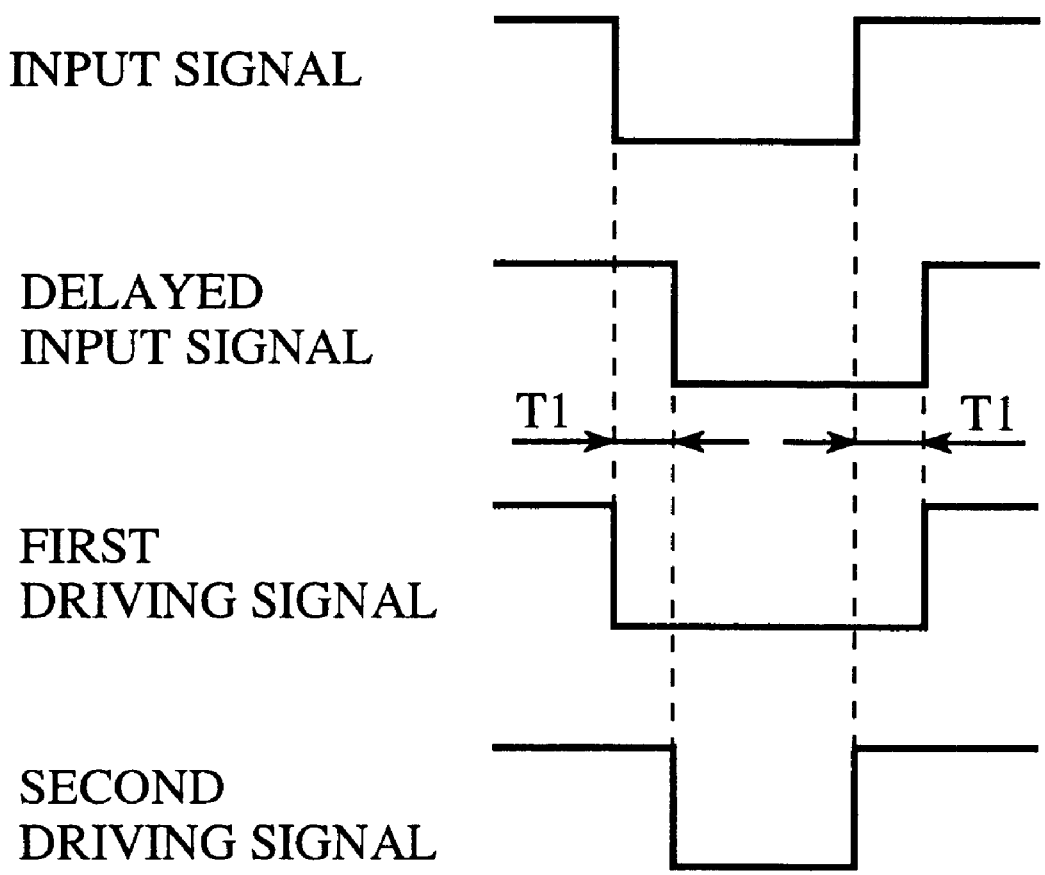
FIG. 7 is a waveform diagram showing the relationship among an input signal, a delayed input signal, a first gate signal produced according to an AND logic and a second gate signal produced according to an OR logic.

FIG. 6 is a circuit diagram showing the configuration of an output buffer device representing a logic device according to a second embodiment of the present invention, and FIG. 7 is a waveform diagram showing the relationship among an input signal, a delayed input signal, a first gate signal produced according to an AND logic and a second gate signal produced according to an OR logic.

As shown in FIG. 6, a reference numeral 200 is an input terminal, and a reference numeral 201 denotes a delayed circuit. The delayed circuit 201 receives an input signal from the input terminal 100 and delays the input signal by a prescribed time-period T1 (for example, 100 nanosecond) to produce a delayed input signal.

A reference numeral 202 denotes an inverter circuit of a high driving performance. The inverter circuit 202 inverts the input signal transmitted from the input terminal 200 through a node N11 to immediately produce an inverted input signal.

A reference symbol CO1 denotes a first-stage output circuit. The first-stage output circuit CO1 receives the inverted input signal transmitting through a node N12 from the inverter circuit 202 and produces a first-stage output signal. The level of the first-stage output signal is immediately and sharply lowered (or heightened) in a first half period of the level change of the first-stage output signal without reaching the L level (or the H level) when the level of the inverted input signal is changed to the H level (or the L level).

A reference number 203 denotes an AND gate (functioning as a control means). The AND gate 203 receives the input signal and the delayed input signal produced by the delaying circuit 201 and performs a well-known AND logic (refer to FIG. 7) according to the input signal and the delayed input signal to produce a first gate signal.

A reference number 204 denotes an OR gate (functioning as the control means). The OR gate 204 receives the input signal and the delayed input signal produced by the delaying circuit 201 and performs a well-known OR logic (refer to FIG. 7) according to the input signal and the delayed input signal to produce a second gate signal.

A reference number 251 denotes a first driving cell (functioning as the control means). The first driving cell 251 receives the first gate signal, which is produced in the AND gate 203 and transmits through a node N14, and produces a first driving signal. The level of the first driving signal is immediately and sharply heightened when the level of the first gate signal is changed to the L level and the level of the first driving signal is gradually lowered when the level of the first gate signal is changed to the H level.

A reference number 252 denotes a second driving cell (functioning as the control means). The second driving cell 252 receives the second gate signal, which is produced in the OR gate 204 and transmits through a node N15, and producing a second driving signal. The level of the second driving signal is gradually heightened when the level of the second gate signal is changed to the L level, and the level of the second driving signal is immediately and sharply lowered when the level of the second gate signal is changed to the H level.

A reference symbol CO2 denotes a second-stage output circuit. The second-stage output circuit CO2 receives the first driving signal which is produced in the first driving cell 251 and transmits through a node N16, receives a second driving signal which is produced in the second driving cell 252 and transmits through a node N17, and produces a second-stage output signal. The level of the second-stage output signal is gradually and sufficiently lowered to the L level when the level of the second driving signal is gradually heightened to the H level, and the level of the second-stage output signal is gradually and sufficiently heightened to the H level when the level of the first driving signal is gradually lowered to the L level.

An output signal is obtained by mixing the first-stage output signal produced in the first-stage output circuit CO1 and the second-stage output signal produced in the second-stage output circuit CO2 with each other at a node N18, and a rise time and a fall time in the output signal is shortened in a second half period of the level change of the output signal because of the second-stage output signal.

The first-stage output circuit CO1 comprises a first-stage output p-channel MOS transistor 209 connected with a terminal of a source voltage VDD and a first-stage output n-channel MOS transistor 210 connected with a terminal of a ground voltage VSS (VSS=0 V) and complementarily operated with the first-stage output p-channel MOS transistor 209. The first-stage output p-channel MOS transistor 209 receives the inverted input signal at its gate, and the first-stage output n-channel MOS transistor 210 receives the inverted input signal at its gate.

The first driving cell 251 comprises a driving p-channel MOS transistor 205 of a high driving performance connected with a terminal of the source voltage VDD and a driving n-channel MOS transistor 206 of a low driving performance connected with a terminal of the ground voltage VSS and complementarily operated with the driving p-channel MOS transistor 205. The driving p-channel MOS transistor 205 receives the first gate signal at its gate, and the driving n-channel MOS transistor 206 receives the first gate signal at its gate.

The second driving cell 252 comprises a driving p-channel MOS transistor 207 of a low driving performance connected with a terminal of the source voltage VDD and a driving n-channel MOS transistor 208 of a high driving performance connected with a terminal of the ground voltage VSS and complementarily operated with the driving p-channel MOS transistor 207. The driving p-channel MOS transistor 207 receives the second gate signal at its gate, and the driving n-channel MOS transistor 208 receives the second gate signal at its gate.

The second-stage output circuit CO2 comprises a second-stage output second-stage output p-channel MOS transistor 211 of a driving performance higher than that of the first-stage output p-channel MOS transistor 209 of the first-stage output circuit CO1 and a second-stage output n-channel MOS transistor 212 of a driving performance higher than that of the first-stage output n-channel MOS transistor 210 of the first-stage output circuit CO1. The second-stage output p-channel MOS transistor 211 is connected with a terminal of the source voltage VDD and receives the first driving signal at its gate, and the n-channel MOS transistor 212 is connected with a terminal of the ground voltage VSS and receives the second driving signal at its gate. The n-channel MOS transistor 212 is complementarily operated with the second-stage output p-channel MOS transistor 211.

A reference symbol CE1 denotes an external load circuit functioning as an external load for the output buffering device. The external load circuit CE1 is composed of a pull-up resistor 213 arranged between a terminal of the source voltage VDD and the node N18 and a condenser 214 arranged between a terminal of the reference level VSS and the node N18. The output signal at the node N18 is used to charge or discharge the external load circuit CE1.

P-channel MOS transistors and n-channel MOS transistors composing the inverter circuit 202 respectively have a channel length L and a channel width W satisfying a high ratio W/L, so that the driving performance of the inverter circuit 202 becomes strong. Therefore, the first-stage output p-channel MOS transistor 209 (or the first-stage output n-channel MOS transistor 210) of the first-stage output circuit CO1 can be immediately and sharply turned on when the level of the inverted input signal is changed to the L level (or the H level).

The driving p-channel MOS transistor 205 and the driving n-channel MOS transistor 208 respectively have a channel length L and a channel width W satisfying a high ratio W/L, so that the driving performance of the transistors 205 and 208 becomes strong. In contrast, the driving n-channel MOS transistor 206 and the driving p-channel MOS transistor 207 respectively have a channel length L and a channel width W satisfying a low ratio W/L, so that the driving performance of the transistors 206 and 207 becomes weak. Therefore, the driving performance of the first driving cell 251 for outputting a first driving signal of the H level is high, the driving performance of the first driving cell 251 for outputting a first driving signal of the L level is low, the driving performance of the second driving cell 252 for outputting a second driving signal of the L level is high, and the driving performance of the second driving cell 252 for outputting a second driving signal of the H level is low.

In the above configuration, an operation of the output buffer device is described with reference to FIG. 8.

Figure 8:
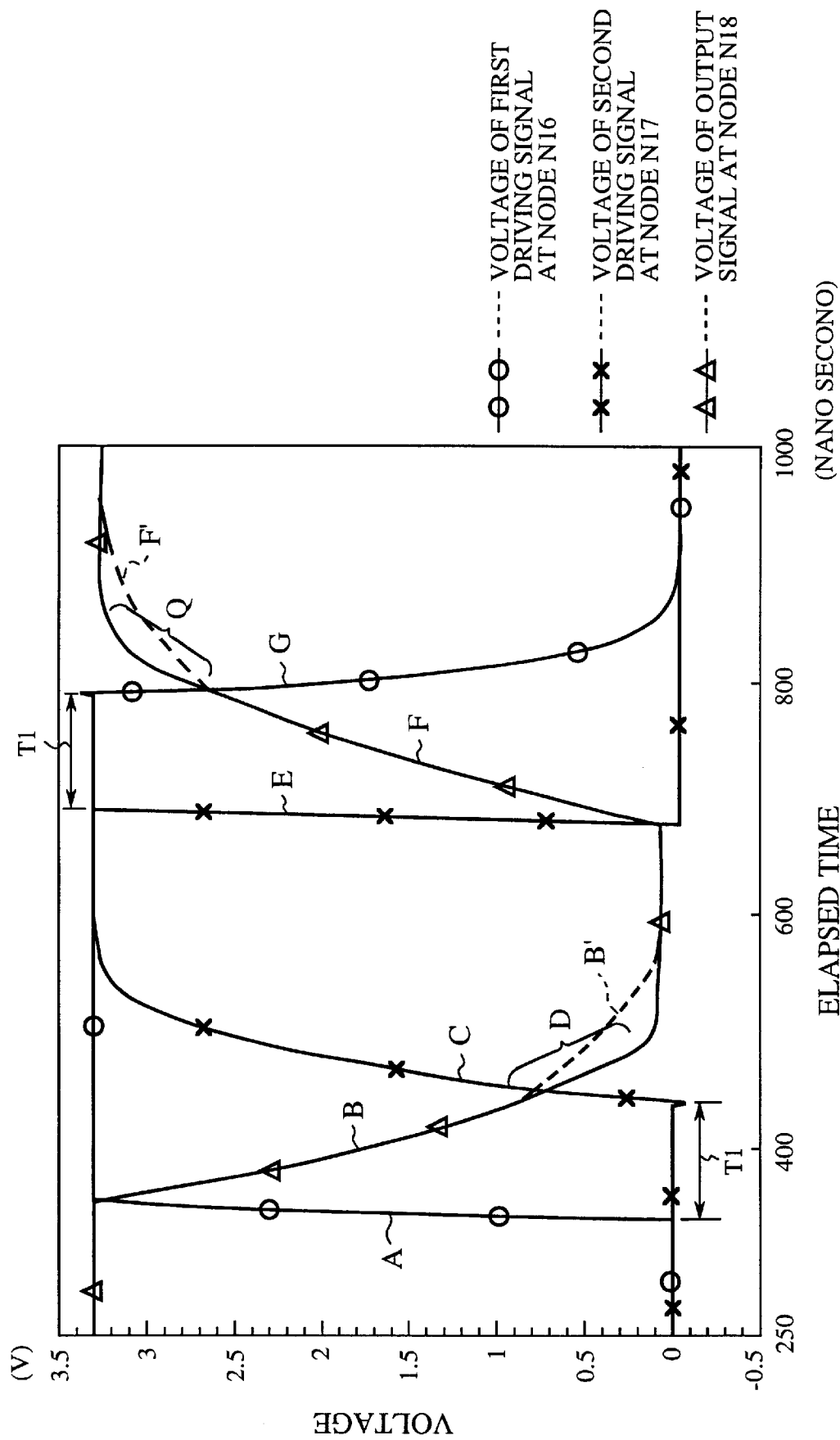
FIG. 8 is a waveform diagram showing a waveform of a first driving signal, a waveform of a second driving signal and a waveform of an output signal.
Figure 9:
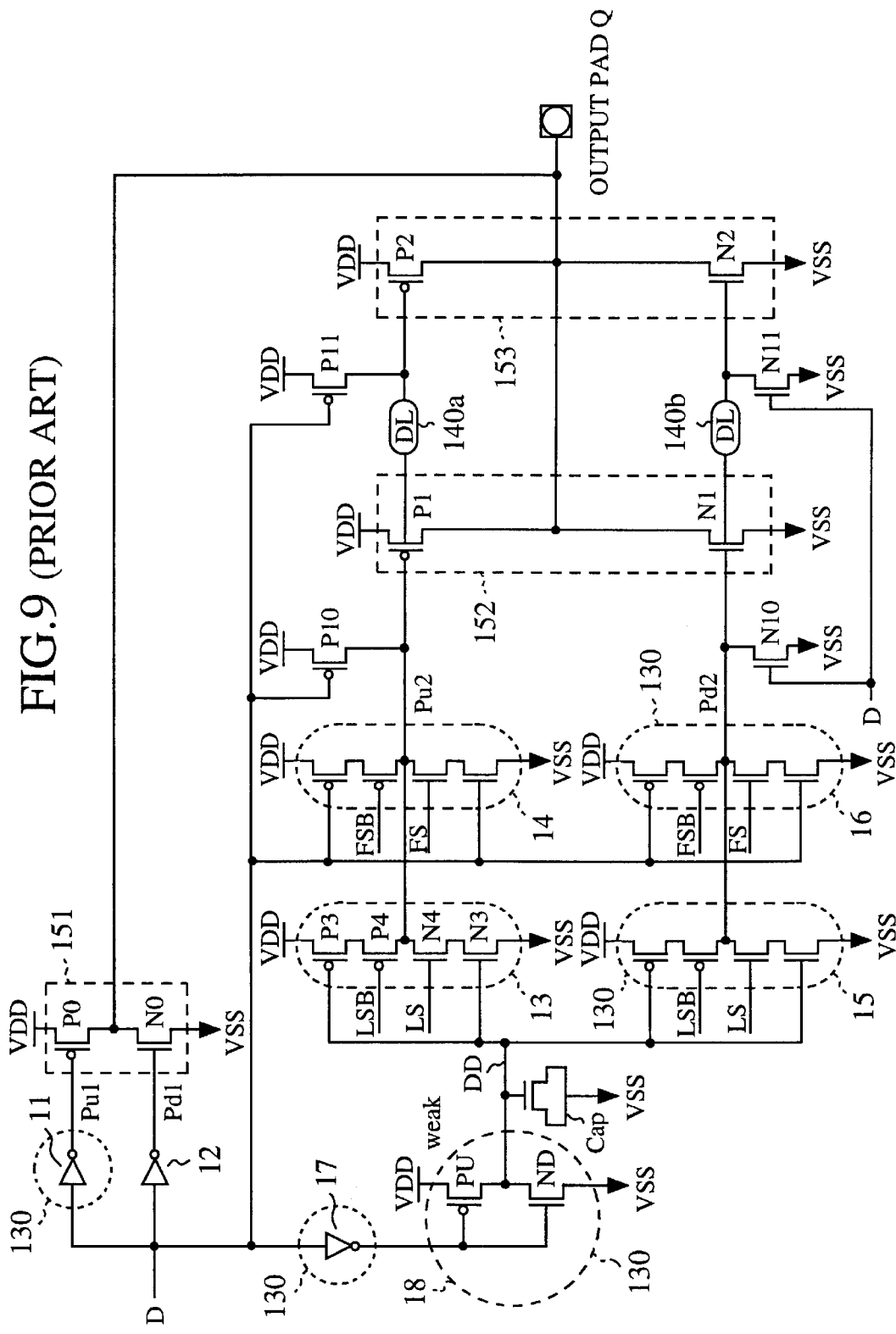
FIG. 9 is a circuit diagram showing the configuration of an output buffer circuit disclosed in the Patent Application No. 17516 of 1999.
Figure 10:
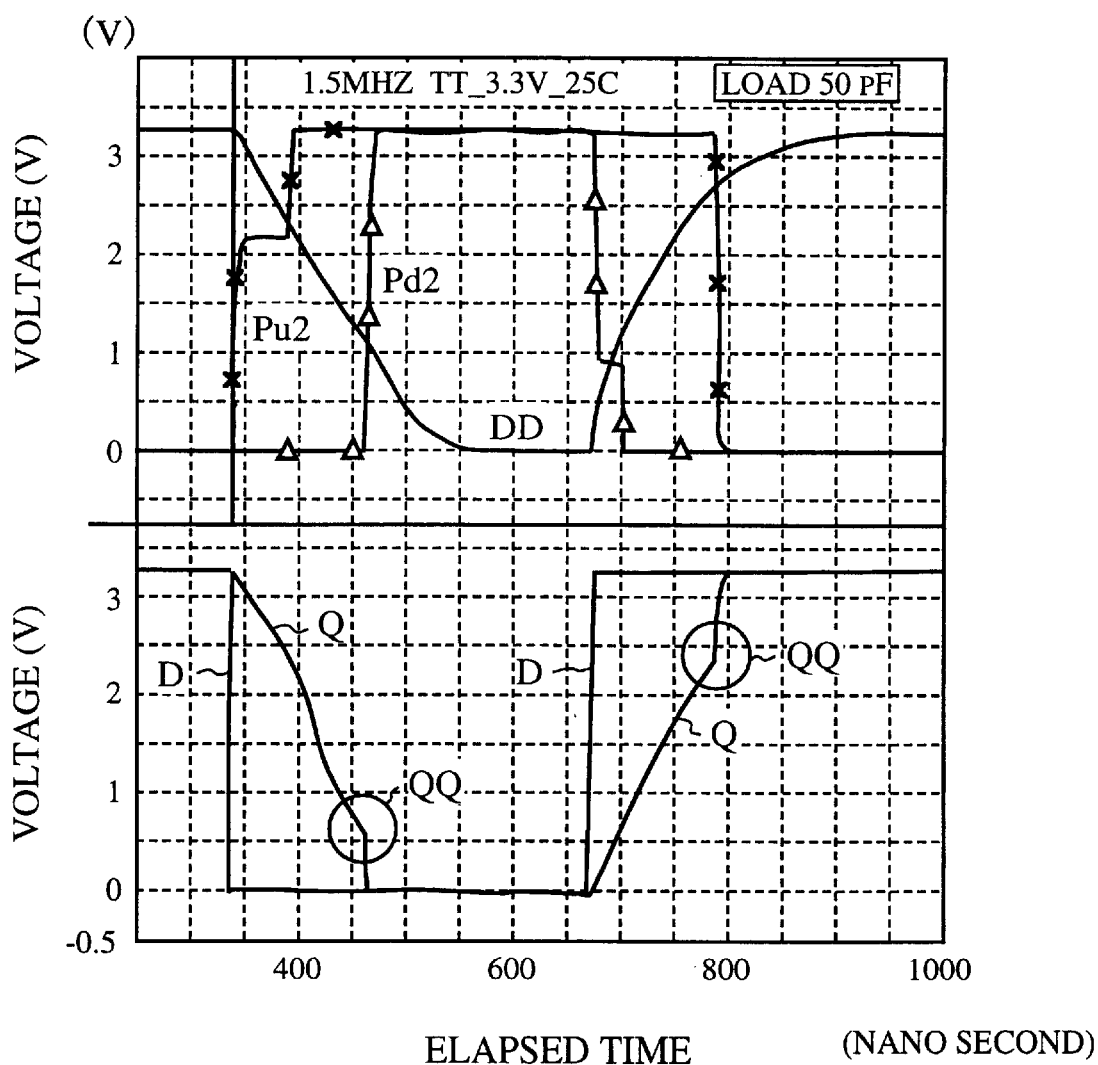
FIG. 10 is a waveform diagram showing simulation results of level changes of output signals in a low speed operation of the output buffer circuit shown in FIG. 9.

FIG. 8 is a waveform diagram showing a waveform of a first driving signal at the node N16, a waveform of a second driving signal at the node N17 and a waveform of an output signal at the node N18. In FIG. 8, a line connecting symbols ○ indicates a voltage waveform of the first driving signal, a line connecting symbols X indicates a voltage waveform of the second driving signal, a line connecting symbols Δ indicates a voltage waveform of the output signal, and two dotted lines indicated by the symbol B' and F' indicates a voltage waveform of the first-stage output signal.

An operation performed when the input signal is changed from the H level to the L level in a fall time is initially described.

When the input signal is set to the H level as an initial condition, the inverted input signal at the node N12 is set to the L level by the inverter circuit 202, the first-stage output signal at the node N18 is set to the H level because the first-stage output p-channel MOS transistor 209 receiving the inverted input signal is set to "on" condition, and the first-stage output n-channel MOS transistor 210 receiving the inverted input signal is set to "off" condition.

Also, the first gate signal at the node N14 is set to the H level because the input signal at the node N11 and the delayed input signal at the node N13 are respectively set to the H level and are input to the AND gate 203, the driving p-channel MOS transistor 205 receiving the first gate signal is set to "off" condition, the driving n-channel MOS transistor 206 receiving the first gate signal is set to "on" condition, the first driving signal at the node N16 is set to the L level by the driving n-channel MOS transistor 206, the second-stage output p-channel MOS transistor 211 of the second-stage output circuit CO2 is set to "on" condition by the first driving signal, and the second-stage output signal at the node N18 is set to the H level by the second-stage output p-channel MOS transistor 211.

Also, the second gate signal at the node N15 is set to the H level because the input signal at the node N11 and the delayed input signal at the node N13 are respectively set to the H level and are input to the OR gate 204, the driving p-channel MOS transistor 207 receiving the second gate signal is set to "off" condition, the driving n-channel MOS transistor 208 receiving the second gate signal is set to "on" condition, the second driving signal at the node N17 is set to the L level by the driving n-channel MOS transistor 208, and the second-stage output n-channel MOS transistor 212 of the second-stage output circuit CO2 is set to "off" condition by the second driving signal.

When the level of the input signal at the node N11 is changed to the L level, the first gate signal at the node N14 is immediately changed to the L level because the input signal of the L level is input to the AND gate 203, the driving n-channel MOS transistor 206 is immediately turn off, and the driving p-channel MOS transistor 205 is immediately turned on. Because the driving p-channel MOS transistor 205 of the high driving performance is immediately turned on, the first driving signal at the node N16 is immediately changed to the H level. Therefore, the second-stage output p-channel MOS transistor 211 of the second-stage output circuit CO2 is immediately turned off by the first driving signal produced by the first driving cell 251.

Also, the inverted input signal at the node N12 is immediately changed to the H level by the inverter circuit 202, the first-stage output p-channel MOS transistor 209 is immediately turned off by the inverted input signal, and the first-stage output n-channel MOS transistor 210 is immediately turned on to lower the level of the first-stage output signal at the node N18. At this time, because the node N18 is connected with the external circuit CE1, a charge of the external circuit CE1 is supplied for the first-stage output signal. Therefore, though the level of the first-stage output signal is immediately and sharply lowered in the first half period of the level change of the first-stage output signal, the level of the first-stage output signal is slowly lowered in the second half period of the level change of the first-stage output signal (refer to the voltage waveform of the first-stage output signal indicated by the dotted line B' in FIG. 8).

Also, when the prescribed time-period T1 passes after the level of the input signal is changed to the L level, the delayed input signal set to the L level is output from the delaying circuit 201 to the node N13, the second gate signal at the node N15 is immediately changed to the L level because the delayed input signal of the L level is input to the OR gate 203, the driving n-channel MOS transistor 208 is immediately turn off in response of the level change of the delayed input signal, and the driving p-channel MOS transistor 207 is immediately turned on in response of the level change of the delayed input signal. Because the driving p-channel MOS transistor 207 of the low driving performance is turned on, the level of the second driving signal at the node N17 is gradually heightened and finally reaches the H level(refer to the voltage waveform of the second driving signal indicated by the symbol C in FIG. 8). Therefore, the second-stage output n-channel MOS transistor 212 of the second-stage output circuit CO2 is gradually turned on and is perfectly turned on finally. Because the gradual turning-on of the second-stage output n-channel MOS transistor 212 is started after the level lowering of the first-stage output signal by the prescribed time-period T1 and because the driving performance of the second-stage output n-channel MOS transistor 212 is higher than that of the first-stage output n-channel MOS transistor 210, the slow level lowering of the output signal at the node N18 is accelerated by the second-stage output signal in the second half period of the level change of the output signal, and the level of the output signal is quickly lowered to the L level (refer to the voltage waveform of the output signal at the end of the level change indicated by the symbol D in FIG. 8).

Accordingly, because the level lowering of the output signal is performed in the second half period of the level change of the output signal by using the second-stage output signal gradually lowered, the level change of the output signal to the L level can be smoothly performed, so that the occurrence of a switching noise in the second-stage output n-channel MOS transistor 212 can be reduced, and the occurrence of higher harmonic wave components in the output signal can be reduced.

Also, because the level of the second driving signal at the node N17 is finally reaches the H level to perfectly turn on the second-stage output n-channel MOS transistor 212 having the driving performance higher than that of the first-stage output n-channel MOS transistor 210, the level of the output signal can be sufficiently and quickly lowered to the L level within the prescribed range of the through rate even though a charge of the external circuit CE1 is supplied for the node N18.

Next, an operation performed when the input signal is changed from the L level to the H level in its raise time is described.

When the input signal is set to the L level as an initial condition, the inverted input signal at the node N12 is set to the H level by the inverter circuit 202, the first-stage output signal at the node N18 is set to the L level because the first-stage output p-channel MOS transistor 209 receiving the inverted input signal is turned off, and the first-stage output n-channel MOS transistor 210 receiving the inverted input signal is turned on.

Also, the first gate signal at the node N14 is set to the L level because the input signal at the node N11 and the delayed input signal at the node N13 are respectively set to the L level and are input to the AND gate 203, the driving p-channel MOS transistor 205 receiving the first gate signal is set to "on" condition, the driving n-channel MOS transistor 206 receiving the first gate signal is set to "off" condition, the first driving signal at the node N16 is set to the H level by the driving n-channel MOS transistor 206, the second-stage output p-channel MOS transistor 211 of the second-stage output circuit CO2 is set to "off" condition by the first driving signal, and the second-stage output signal at the node N18 is set to the L level by the second-stage output p-channel MOS transistor 211

Also, the second gate signal at the node N15 is set to the L level because the input signal at the node N11 and the delayed input signal at the node N13 are respectively set to the L level and are input to the OR gate 204, the driving p-channel MOS transistor 207 receiving the second gate signal is set to "on" condition, the driving n-channel MOS transistor 208 receiving the second gate signal is set to "off" condition, the second driving signal at the node N17 is set to the H level by the driving n-channel MOS transistor 208, and the second-stage output n-channel MOS transistor 212 of the second-stage output circuit CO2 is set to "on" condition by the second driving signal.

When the level of the input signal at the node N11 is changed to the H level, the second gate signal at the node N15 is immediately changed to the H level because the input signal of the H level is input to the OR gate 203, the driving n-channel MOS transistor 208 is immediately turn on, and the driving p-channel MOS transistor 207 is immediately turned off. Therefore, the second driving signal at the node N17 is immediately changed to the L level by the driving n-channel MOS transistor 208, and the second-stage output n-channel MOS transistor 212 of the second-stage output circuit CO2 is immediately turned off.

Also, the inverted input signal at the node N12 is immediately changed to the L level by the inverter circuit 202, the first-stage output n-channel MOS transistor 210 is immediately turned off, and the first-stage output p-channel MOS transistor 209 is immediately turned on by the inverted input signal to heighten the level of the first-stage output signal at the node N18. At this time, because the node N18 is connected with the external circuit CE1, a charge of the node N18 is discharged to the external circuit CE1. Therefore, though the level of the first-stage output signal is immediately and sharply heightened in the first half period of the level change of the first-stage output signal, the level of the first-stage output signal is slowly heightened in the second half period of the level change of the first-stage output signal (refer to the voltage waveform of the first-stage output signal indicated by the dotted line F' in FIG. 8).

Also, when the prescribed time-period T1 passes after the level of the input signal is changed to the L level, the delayed input signal set to the H level is output from the delaying circuit 201 to the node N13, the first gate signal at the node N14 is immediately changed to the H level because the delayed input signal of the H level is input to the AND gate 203 with the input signal of the H level, the driving p-channel MOS transistor 205 is immediately turn off in response to the level change of the delayed input signal, and the driving n-channel MOS transistor 206 is immediately turned on in response to the level change of the delayed input signal. Because the driving n-channel MOS transistor 206 of the low driving performance is turned on, the level of the first driving signal at the node N16 is gradually lowered and finally reaches the H level (refer to the voltage waveform of the first driving signal indicated by the symbol G in FIG. 8). Therefore, the second-stage output p-channel MOS transistor 211 of the second-stage output circuit CO2 is gradually turned on and is perfectly turned on finally. Because the gradual turning-on of the second-stage output p-channel MOS transistor 211 is started after the level heightening of the first-stage output signal by the prescribed time-period T1 and because the driving performance of the second-stage output p-channel MOS transistor 211 is higher than that of the first-stage output p-channel MOS transistor 209, the slow level heightening of the output signal at the node N18 is accelerated by the second-stage output signal in the second half period of the level change of the output signal, and the level of the output signal is quickly heightened to the H level (refer to the voltage waveform of the output signal at the end of the level change indicated by the symbol Q in FIG. 8).

Accordingly, because the level heightening of the output signal is performed in the second half period of the level change of the output signal by using the second-stage output signal gradually heightened, the level change of the output signal to the H level can be smoothly performed, so that the occurrence of a switching noise in the second-stage output p-channel MOS transistor 211 can be reduced, and the occurrence of higher harmonic wave components in the output signal can be reduced.

Also, because the level of the first driving signal at the node N16 is finally reaches the L level to perfectly turn on the second-stage output p-channel MOS transistor 211 having the driving performance higher than that of the first-stage output p-channel MOS transistor 209, the level of the output signal can be sufficiently and quickly heightened to the H level within the prescribed range of the through rate even though a charge of the node N18 is discharged to the external circuit CE1.

In this embodiment, a time interval from one level change of the input signal to the next level change of the input signal is sufficiently longer than a sum of the prescribed time-period T1 in the delaying circuit 201 and a time period required for one level change of the first driving signal (or the second driving signal).

In cases where the output buffer device is used to produce a differential signal output from a differential amplifier, the output buffer devices, in which a cross point of waveforms of two differential signals and a ratio of through rates in the differential signals are respectively set within a prescribed range, can be obtained.

Also, the output buffer device is described as the representative of the logic device. However, in cases where one or more inverters, of which the number is odd, are arranged in the node N11, an inverter device representing the logic device can be obtained. Also, in cases where a plurality of gate circuits such as an AND circuit, an OR circuit and the like are arranged in the node N11, a gate device representing the logic device can be obtained.

What is claimed is:

1. A logic device in which a pair of output-stage transistors complementarily operated with each other are controlled according to an input signal received at an input terminal to output an output signal corresponding to the input signal to an output terminal and to charge or discharge an external load, comprising:
    a control circuit for controlling one output-stage transistor, which is to be controlled to a turn-off condition, to be immediately turned off by a first condenser and a transistor of a strong driving performance, and controlling the other output-stage transistor, which is to be controlled to a turn-on condition, to be successively and smoothly turned on by a second condenser and a plurality of transistors respectively having a weak driving performance while controlling the other output-stage transistor by one transistor of the weak driving performance at a turning-on speed, at which a through rate is set within a prescribed range in a beginning period changing to the turn-on condition; and
    a manufacturing error correcting circuit for correcting a ratio of a rise time to a fall time in the output signal output to the output terminal to set the ratio within a prescribed range regardless of a driving performance difference between a group of first-conductive-type MOS transistors and a group of second-conductive-type MOS transistors caused by manufacturing errors.

2. The logic device according to claim 1, wherein the control circuit comprises:
    a first transistor, having a middle driving performance, for functioning in the beginning of a period in which the output-stage transistor to be controlled to the turn-on condition is changed to the turn-on condition and controlling the output-stage transistor, which is to be controlled to the turn-on condition, at the turning-on speed, at which the through rate of the output signal at the output terminal is set within the prescribed range; and a second transistor, having a weak driving performance, for controlling the output stage transistor, which is to be controlled to the turn-on condition, in a transition period continued until the output-stage transistor is changed to the turn-on condition and reaches a steady condition and making the output-stage transistor, which is to be controlled to the turn-on condition, output the output signal in which a higher harmonic component is reduced.

3. The logic device according to claim 1, wherein the control circuit comprises:
    a first driving cell comprising
        a first-conductive-type MOS transistor of a strong driving performance, connected with a terminal of a source level, for controlling the output-stage first-conductive-type transistor to be controlled to the turn-off condition, which is arranged between the terminal of the source level and the output terminal, according to the input signal received in the input terminal so as to be immediately controlled to the turn-off condition; and
        a second-conductive-type MOS transistor of a weak driving performance, connected with a terminal of a reference level and complementarily operated with the first-conductive-type MOS transistor, for controlling the output-stage first-conductive-type transistor, which is to be controlled to the turn-on condition, so as to be gradually turned on according to the input signal received in the input terminal,
    a second driving cell comprising
        a second-conductive-type MOS transistor of a strong driving performance, connected with the terminal of the reference level, for controlling the output-stage second-conductive-type transistor to be controlled to the turn-off condition, which is arranged between the terminal of the reference level and the output terminal, according to the input signal received in the input terminal so as to be immediately controlled to the turn-off condition; and
        a first-conductive-type MOS transistor of a weak driving performance, connected with the terminal of the source level and complementarily operated with the second-conductive-type MOS transistor, for controlling the output-stage second-conductive-type transistor, which is to be controlled to the turn-on condition, so as to be gradually turned on according to the input signal received in the input terminal, and
    a through rate correcting circuit for controlling the output-stage second-conductive-type MOS transistor to be turned on at the turning-on speed, at which the through rate of the output signal output to the output terminal is set within the prescribed range, in the beginning period, in which the output-stage second-conductive-type MOS transistor is controlled by the second driving cell to be gradually turned on, and controlling the output-stage first-conductive-type MOS transistor to be turned on at the turning-on speed, at which the through rate of the output signal output to the output terminal is set within the prescribed range, in the beginning period, in which the output-stage first-conductive-type MOS transistor is controlled by the first driving cell to be gradually turned on.

4. The logic device according to claim 3, wherein the through rate correcting circuit comprises:
    a second-conductive-type MOS transistor of a middle driving performance, arranged between a gate of the output-stage second-conductive-type MOS transistor and the terminal of the source level, for controlling the output-stage second-conductive-type transistor according to an inverted signal of the input signal received at the input terminal to be turned on at the turning-on speed, at which the through rate of the output signal output to the output terminal is set within the prescribed range, in the beginning period in which the output-stage second-conductive-type MOS transistor is controlled by the second driving cell to be gradually turned on; and a first-conductive-type MOS transistor of a middle driving performance, arranged between a gate of the output-stage first-conductive-type MOS transistor and the terminal of the reference level, for controlling the output-stage first-conductive-type transistor according to the inverted signal of the input signal received at the input terminal to be turned on at the turning-on speed, at which the through rate of the output signal output to the output terminal is set within the prescribed range, in the beginning period in which the output-stage first-conductive-type MOS transistor is controlled by the first driving cell to be gradually turned on.

5. The logic device according to claim 1, wherein the manufacturing error correcting circuit comprises:

a manufacturing error correcting second-conductive-type MOS transistor, connected with the output-stage first-conductive-type MOS transistor in parallel to each other and cooperated with the output-stage first-conductive-type MOS transistor; and a manufacturing error correcting first-conductive-type MOS transistor, connected with the output-stage second-conductive-type MOS transistor in parallel to each other, cooperated with the output-stage second-conductive-type MOS transistor and complementarily operated with the manufacturing error correcting second-conductive-type MOS transistor.

6. A logic device, comprising:

a control circuit having a pair of first-stage output transistors, which are complementarily operated with each other and are controlled according to an inverted signal which is obtained by inverting an input signal received at an input terminal and has a strong driving performance, for outputting an output signal corresponding to the input signal to an output terminal and charging or discharging an output load; and a pair of second-stage output transistors, which respectively have a driving performance stronger than that of the first-stage output transistors and are complementarily operated with each other, for performing an operation in parallel to the operation of the first-stage output transistors and correcting a through rate of the output signal output from the first-stage output transistors to the output terminal, wherein one second-stage output transistor, which is to be controlled to a turn-off condition, is controlled according to the input signal and a delayed input signal obtained by delaying the input signal to be immediately turned off by a transistor of a strong driving performance, and the other second-stage output transistor, which is to be controlled to a turn-on condition, is controlled according to the input signal and the delayed input signal to be turned on in a latter period changing to the turn-on condition while successively and smoothly controlling the other second-stage output transistor at first by a transistor of a weak driving performance and controlling the other second-stage output transistor at a turning-on speed at which the through rate is set within a prescribed range, wherein the first-stage output transistors are a first-stage output first-conductive-type MOS transistor, which is connected with a terminal of a source voltage, and a first-stage output second-conductive type MOS transistor, which is connected with a terminal of a reference voltage, complementarily operated with each other, the second-stage output transistors are a second-stage output first-conductive-type MOS transistor, which is connected with the terminal of the source voltage, and a second-stage output second-conductive-type MOS transistor, which is connected with the terminal of the reference voltage, complementarily operated with each other, and the control circuit comprises a first driving cell comprising:

a first-conductive-type MOS transistor of a strong driving performance for controlling the second-stage output first-conductive-type transistor, which is to be controlled to the turn-off condition, to be immediately turned off according to the delayed input signal; and a second-conductive-type MOS transistor of a weak driving performance, complementarily operated with the first-conductive-type MOS transistor, for controlling the second-stage-output first-conductive-type transistor, which is to be controlled to turn-on condition, to be successively and smoothly turned on in the later period changing to the turn-on condition at the turning-on speed at which the through rate is set within the prescribed range, and a second driving cell comprising:

a second-conductive type MOS transistor of a strong driving performance for controlling the second-stage output second-conductive-type transistor, which is to be controlled to the turn-off condition, to be immediately turned off according to the delayed input signal; and a first-conductive-type MOS transistor of a weak driving performance, complementarily operated with the second-conductive-type MOS transistor, for controlling the second-stage-output second-conductive-type transistor, which is to be controlled to turn-on condition, to be successively and smoothly turned on in the later period changing to the turn-on condition at the turning-on speed at which the through rate is set within the prescribed range.

7. The logic device according to claim 6, wherein the control circuit further comprises:

an AND gate for producing a first driving signal from the input signal and the delayed input signal according to an AND logic and transmitting the first driving signal to a gate of the first-conductive-type MOS transistor of the first driving cell and a gate of the second-conductive-type MOS transistor of the first driving cell, the first driving signal performing a first level change in response to a first level change of the input signal and performing a second level change in response to a second level change of the delayed input signal; and an OR gate for producing a second driving signal from the input signal and the delayed input signal according to an OR logic and transmitting the second driving signal to a gate of the first-conductive-type MOS transistor of the second driving cell and a gate of the second-conductive-type MOS transistor of the second driving cell, the second driving signal performing the second level change in response to the second level change of the input signal and performing the first level change in response to the first level change of the delayed input signal.

* * * * *

UNITED STATES PATENT AND TRADEMARK OFFICE
CERTIFICATE OF CORRECTION

PATENT NO. : 6,441,644 B1
DATED : August 27, 2002
INVENTOR(S) : Wataru Tanaka

It is certified that error appears in the above-identified patent and that said Letters Patent is hereby corrected as shown below:

<u>Title page,</u>
Item [73], Assignees is corrected to read:
-- [73] Assignee: Mitsubishi Denki Kabushiki Kaisha, Tokyo; Mitsubishi Electric System LSI Design Corporation, Itami, both of (JP) --

Signed and Sealed this

Twentieth Day of May, 2003

JAMES E. ROGAN
*Director of the United States Patent and Trademark Office*